US012676455B2

(12) United States Patent
Fujii et al.

(10) Patent No.: US 12,676,455 B2
(45) Date of Patent: Jul. 7, 2026

(54) ELECTRONIC DEVICE MANUFACTURING METHOD, LASER DEVICE, AND WAVELENGTH SEQUENCE CALCULATION SYSTEM

(71) Applicant: Gigaphoton Inc., Tochigi (JP)

(72) Inventors: Koichi Fujii, Oyama (JP); Takanobu Ishihara, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 106 days.

(21) Appl. No.: 18/735,830

(22) Filed: Jun. 6, 2024

(65) Prior Publication Data

US 2024/0322521 A1    Sep. 26, 2024

Related U.S. Application Data

(63) Continuation of application No. PCT/JP2022/000609, filed on Jan. 11, 2022.

(51) Int. Cl.
*H01S 5/062*         (2006.01)
*G03F 7/00*          (2006.01)

(52) U.S. Cl.
CPC ...... *H01S 5/06233* (2013.01); *G03F 7/70025* (2013.01); *G03F 7/70041* (2013.01); *G03F 7/70525* (2013.01); *G03F 7/70575* (2013.01)

(58) Field of Classification Search
CPC ............. H01S 5/06233; G03F 7/70025; G03F 7/70041; G03F 7/70525; G03F 7/70575; G03F 7/20
See application file for complete search history.

(56) References Cited

U.S. PATENT DOCUMENTS 7,298,770 B2 * 11/2007 Spangler ................. H01S 3/104
                                                            372/24
8,989,225 B2 * 3/2015 Kakizaki ............... H01S 5/0092
                                                            372/29.013

(Continued)

FOREIGN PATENT DOCUMENTS

JP          07-058393 A      3/1995
JP          2007-511074 A    4/2007

(Continued)

OTHER PUBLICATIONS

International Search Report issued in PCT/JP2022/000609; mailed Mar. 29, 2022.

(Continued)

*Primary Examiner* — Hung V Nguyen
(74) *Attorney, Agent, or Firm* — Studebaker Brackett PLLC

(57)         ABSTRACT

An electronic device manufacturing method includes acquiring a pulse spectral shape of pulse laser light, and a target integrated spectral shape realized by the pulse laser light of pulses generated based on wavelength sequence in which a center wavelength of the pulse laser light periodically changes; calculating target center wavelengths allocated to the pulses to realize the target integrated spectral shape, and a number of allocation pulses of each target center wavelength being the number of allocation pulses per cycle of the wavelength sequence; calculating the wavelength sequence by correspondingly allocating at least one first center wavelength having the number of allocation pulses of 2 or greater so that the smaller the number of allocation pulses is, the larger a time interval of the allocation pulses for the first center wavelength is, and then correspondingly allocating at least one second center wavelength having the number of allocation pulses of 1.

20 Claims, 19 Drawing Sheets

(56)              References Cited

U.S. PATENT DOCUMENTS

| | | | | |
|---|---|---|---|---|
| 11,764,541 | B2 * | 9/2023 | Miura | H01S 5/06808 |
| | | | | 372/25 |
| 12,438,333 | B2 * | 10/2025 | Kumazaki | H01S 3/10069 |
| 2005/0083983 | A1 | 4/2005 | Sandstrom et al. | |
| 2008/0129974 | A1 | 6/2008 | Asaishi | |
| 2009/0002666 | A1 | 1/2009 | Tsuchiya | |
| 2009/0147231 | A1 | 6/2009 | Sukegawa | |

FOREIGN PATENT DOCUMENTS

| | | | |
|---|---|---|---|
| JP | 2008-140956 | A | 6/2008 |
| JP | 2009-010231 | A | 1/2009 |
| JP | 2009-141154 | A | 6/2009 |

OTHER PUBLICATIONS

International Preliminary Report On Patentability and Written Opinion issued in PCT/JP2022/000609; issued Jun. 20, 2024.

\* cited by examiner

FIG. 1

FIG. 6
|  |  | tk | | | | |
|---|---|---|---|---|---|---|
|  |  | t1 | t2 | t3 | t4 | t5 |
| λi | λ1 | 1 | 1 | 0 | 0 | 0 |
|  | λ2 | 0 | 0 | 1 | 0 | 0 |
|  | λ3 | 0 | 0 | 0 | 1 | 1 |
FIG. 7
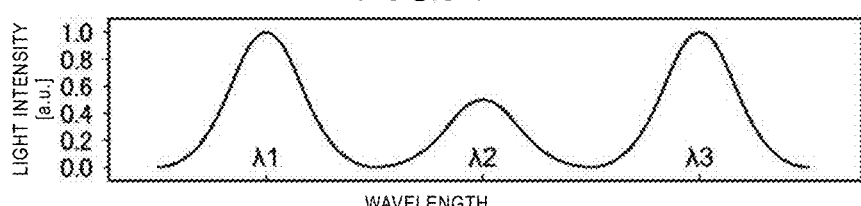
FIG. 8
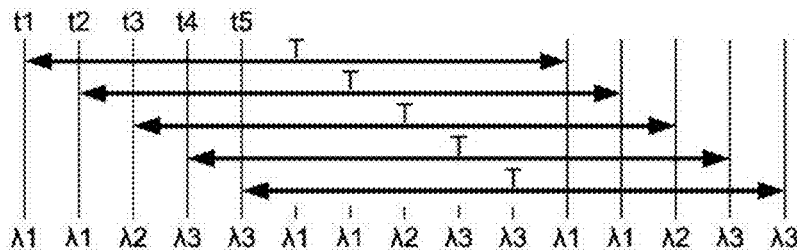
FIG. 9
|  |  | t1+T | t2+T | t3+T | t4+T | t5+T |
|---|---|---|---|---|---|---|
| λi | λ1 | 5 | 5 | 4 | 4 | 4 |
|  | λ2 | 2 | 2 | 3 | 2 | 2 |
|  | λ3 | 4 | 4 | 4 | 5 | 5 |
| Ns | | 11 | 11 | 11 | 11 | 11 |

FIG. 12

LASER CONTROL PROCESSOR TRANSMITS PULSE SPECTRAL SHAPE g
TO EXPOSURE CONTROL PROCESSOR

S1
START

S11

RECEIVE TARGET SPECTRAL LINE WIDTH Δλt FROM EXPOSURE CONTROL PROCESSOR

S12

GENERATE PULSE LASER LIGHT

S13

MEASURE PULSE SPECTRAL SHAPE g

S14

TRANSMIT PULSE SPECTRAL SHAPE g TO EXPOSURE CONTROL PROCESSOR

RETURN

FIG. 15

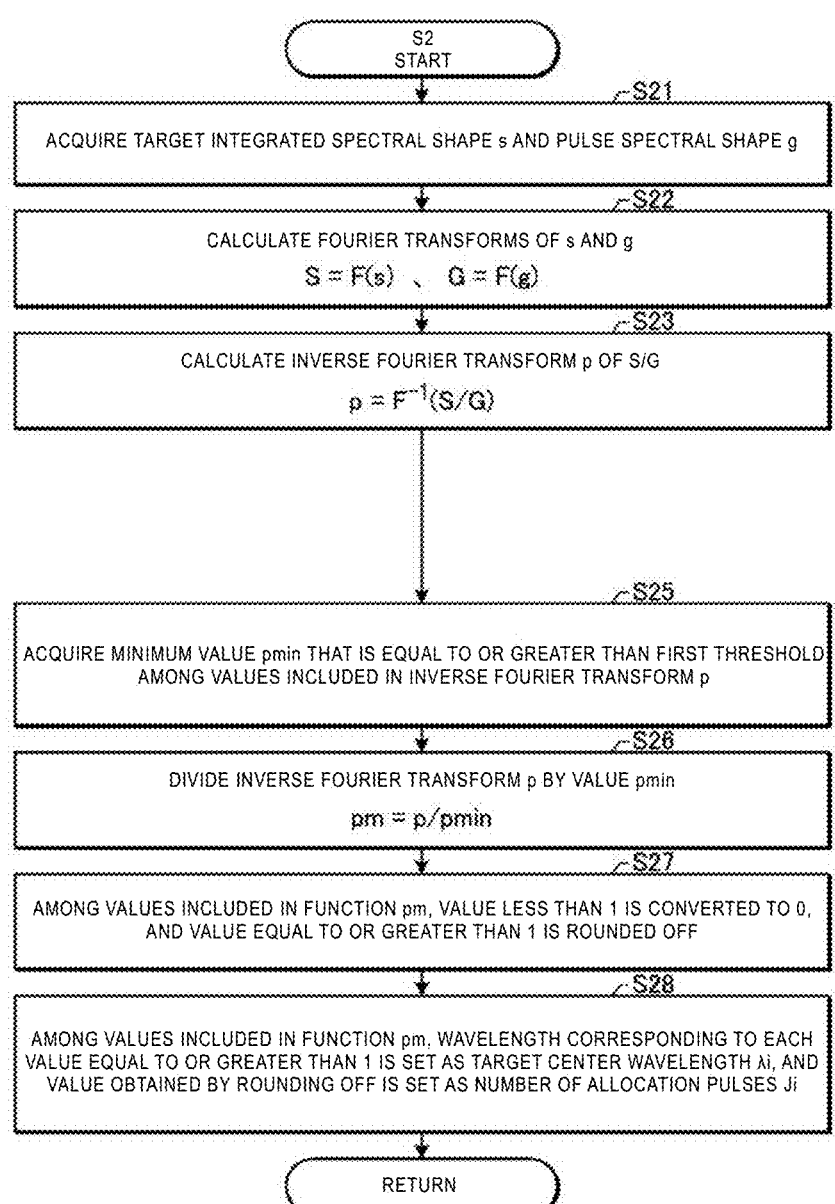

EXPOSURE CONTROL PROCESSOR CALCULATES TARGET CENTER WAVELENGTH λi
AND NUMBER OF ALLOCATION PULSES Ji

S2
START

S21

ACQUIRE TARGET INTEGRATED SPECTRAL SHAPE s AND PULSE SPECTRAL SHAPE g

S22

CALCULATE FOURIER TRANSFORMS OF s AND g $$S = F(s) \, , \quad G = F(g)$$

S23

CALCULATE INVERSE FOURIER TRANSFORM p OF S/G $$p = F^{-1}(S/G)$$

S25

ACQUIRE MINIMUM VALUE pmin THAT IS EQUAL TO OR GREATER THAN FIRST THRESHOLD
AMONG VALUES INCLUDED IN INVERSE FOURIER TRANSFORM p

S26

DIVIDE INVERSE FOURIER TRANSFORM p BY VALUE pmin $$pm = p/pmin$$

S27

AMONG VALUES INCLUDED IN FUNCTION pm, VALUE LESS THAN 1 IS CONVERTED TO 0,
AND VALUE EQUAL TO OR GREATER THAN 1 IS ROUNDED OFF

S28

AMONG VALUES INCLUDED IN FUNCTION pm, WAVELENGTH CORRESPONDING TO EACH
VALUE EQUAL TO OR GREATER THAN 1 IS SET AS TARGET CENTER WAVELENGTH λi, AND
VALUE OBTAINED BY ROUNDING OFF IS SET AS NUMBER OF ALLOCATION PULSES Ji

RETURN

TARGET INTEGRATED SPECTRAL SHAPE s

PULSE SPECTRAL SHAPE g

FIG. 19

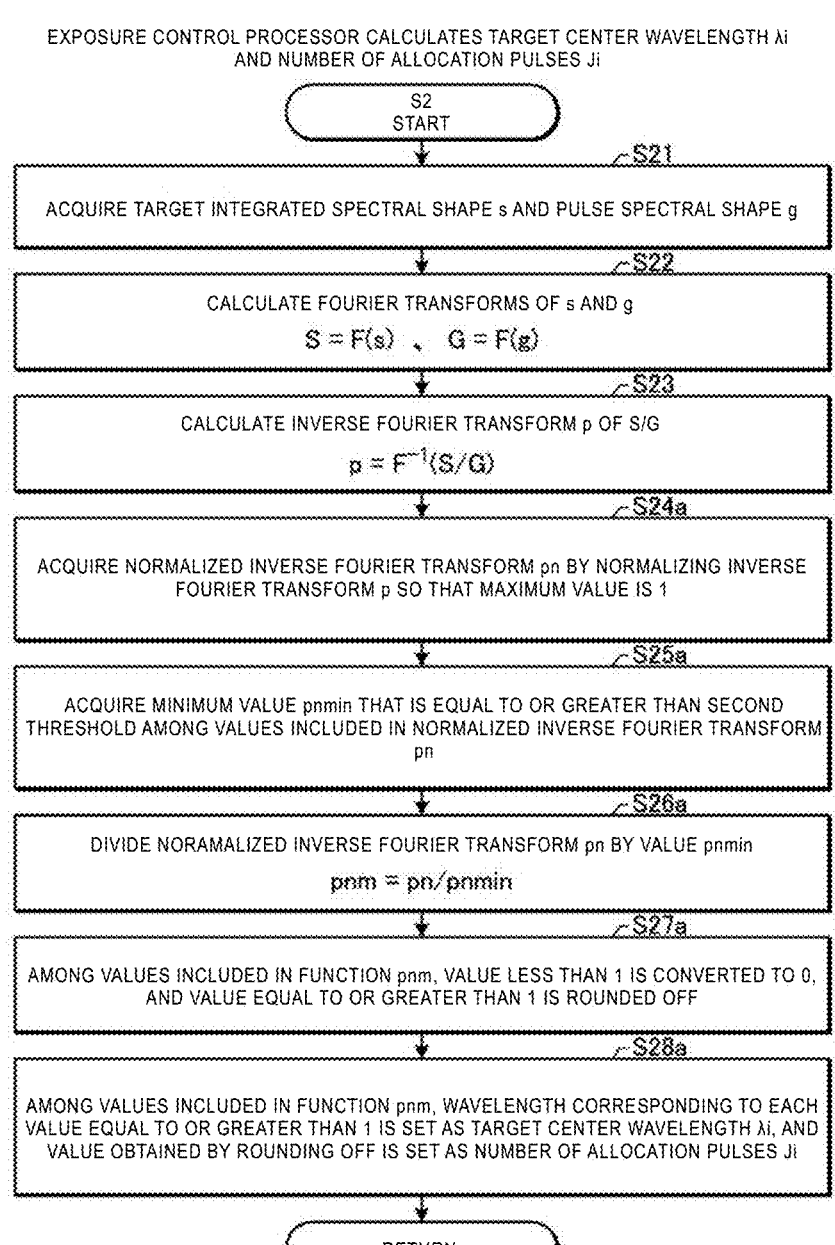

EXPOSURE CONTROL PROCESSOR CALCULATES TARGET CENTER WAVELENGTH $\lambda i$
AND NUMBER OF ALLOCATION PULSES $Ji$

S2
START

S21

ACQUIRE TARGET INTEGRATED SPECTRAL SHAPE s AND PULSE SPECTRAL SHAPE g

S22

CALCULATE FOURIER TRANSFORMS OF s AND g $$S = F(s) \quad G = F(g)$$

S23

CALCULATE INVERSE FOURIER TRANSFORM p OF S/G $$p = F^{-1}(S/G)$$

S24a

ACQUIRE NORMALIZED INVERSE FOURIER TRANSFORM pn BY NORMALIZING INVERSE
FOURIER TRANSFORM p SO THAT MAXIMUM VALUE IS 1

S25a

ACQUIRE MINIMUM VALUE pnmin THAT IS EQUAL TO OR GREATER THAN SECOND
THRESHOLD AMONG VALUES INCLUDED IN NORMALIZED INVERSE FOURIER TRANSFORM
pn S26a DIVIDE NORAMALIZED INVERSE FOURIER TRANSFORM pn BY VALUE pnmin $$pnm = pn/pnmin$$

S27a

AMONG VALUES INCLUDED IN FUNCTION pnm, VALUE LESS THAN 1 IS CONVERTED TO 0,
AND VALUE EQUAL TO OR GREATER THAN 1 IS ROUNDED OFF S28a AMONG VALUES INCLUDED IN FUNCTION pnm, WAVELENGTH CORRESPONDING TO EACH
VALUE EQUAL TO OR GREATER THAN 1 IS SET AS TARGET CENTER WAVELENGTH $\lambda i$, AND
VALUE OBTAINED BY ROUNDING OFF IS SET AS NUMBER OF ALLOCATION PULSES $Ji$

RETURN

FIG. 20

EXPOSURE CONTROL PROCESSOR CALCULATES WAVELENGTH SEQUENCE

S3
START

S31

CALCULATE NUMBER OF IN-CYCLE PULSES Kmax OF WAVELENGTH SEQUENCE BY
SUMMING NUMBER OF ALLOCATION PULSES Ji

S32

CALCULATE ALLOCATION INTERVAL IVi OF TARGET CENTER WAVELENGTHS λi HAVING
NUMBER OF ALLOCATION PULSES Ji OF 2 OR GREATER $$IVi = Kmax/Ji$$

S33

ALLOCATE TARGET CENTER WAVELENGTHS λi HAVING NUMBER OF ALLOCATION PULSES
Ji OF 2 OR GREATER TO WAVELENGTH SEQUENCE

S34

ALLOCATE TARGET CENTER WAVELENGTHS λi HAVING NUMBER OF ALLOCATION PULSES
Ji OF 1 TO WAVELENGTH SEQUENCE

RETURN

FIG. 21

BEFORE IMPROVEMENT

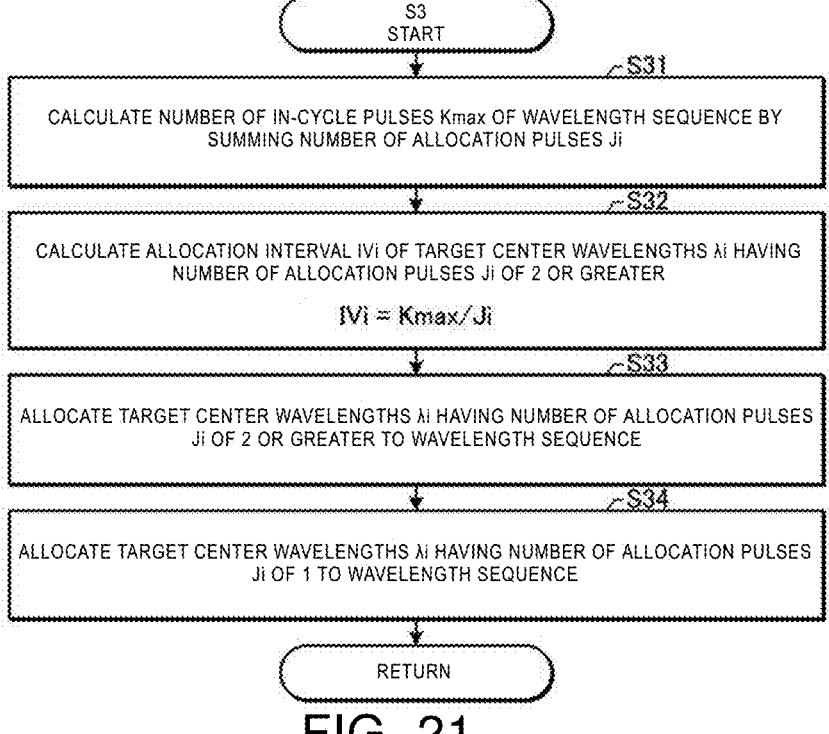

| | | Ji | tk | | | | | | | | | |
|---|---|---|---|---|---|---|---|---|---|---|---|---|
| | | | t1 | t2 | t3 | t4 | t5 | t6 | t7 | t8 | t9 | t10 |
| λi | λ1 | 2 | 1 | 1 | 0 | 0 | 0 | 0 | 0 | 0 | 0 | 0 |
| | λ2 | 1 | 0 | 0 | 1 | 0 | 0 | 0 | 0 | 0 | 0 | 0 |
| | λ3 | 1 | 0 | 0 | 0 | 1 | 0 | 0 | 0 | 0 | 0 | 0 |
| | λ4 | 1 | 0 | 0 | 0 | 0 | 1 | 0 | 0 | 0 | 0 | 0 |
| | λ5 | 1 | 0 | 0 | 0 | 0 | 0 | 1 | 0 | 0 | 0 | 0 |
| | λ6 | 1 | 0 | 0 | 0 | 0 | 0 | 0 | 1 | 0 | 0 | 0 |
| | λ7 | 3 | 0 | 0 | 0 | 0 | 0 | 0 | 0 | 1 | 1 | 1 |

FIG. 22

AFTER IMPROVEMENT (S33)

| | | Ji | tk | | | | | | | | | |
|---|---|---|---|---|---|---|---|---|---|---|---|---|
| | | | t1 | t2 | t3 | t4 | t5 | t6 | t7 | t8 | t9 | t10 |
| λi | λ1 | 2 | 1 | 0 | 0 | 0 | 0 | 1 | 0 | 0 | 0 | 0 |
| | λ2 | 1 | | | | | | | | | | |
| | λ3 | 1 | | | | | | | | | | |
| | λ4 | 1 | | | | | | | | | | |
| | λ5 | 1 | | | | | | | | | | |
| | λ6 | 1 | | | | | | | | | | |
| | λ7 | 3 | 0 | 1 | 0 | 0 | 1 | 0 | 0 | 1 | 0 | 0 |

FIG. 23

AFTER IMPROVEMENT (S34)

| | | Ji | tk | | | | | | | | | |
|---|---|---|---|---|---|---|---|---|---|---|---|---|
| | | | t1 | t2 | t3 | t4 | t5 | t6 | t7 | t8 | t9 | t10 |
| λi | λ1 | 2 | 1 | 0 | 0 | 0 | 0 | 1 | 0 | 0 | 0 | 0 |
| | λ2 | 1 | 0 | 0 | 1 | 0 | 0 | 0 | 0 | 0 | 0 | 0 |
| | λ3 | 1 | 0 | 0 | 0 | 1 | 0 | 0 | 0 | 0 | 0 | 0 |
| | λ4 | 1 | 0 | 0 | 0 | 0 | 0 | 0 | 1 | 0 | 0 | 0 |
| | λ5 | 1 | 0 | 0 | 0 | 0 | 0 | 0 | 0 | 0 | 1 | 0 |
| | λ6 | 1 | 0 | 0 | 0 | 0 | 0 | 0 | 0 | 0 | 0 | 1 |
| | λ7 | 3 | 0 | 1 | 0 | 0 | 1 | 0 | 0 | 1 | 0 | 0 |

ELECTRONIC DEVICE MANUFACTURING METHOD, LASER DEVICE, AND WAVELENGTH SEQUENCE CALCULATION SYSTEM

CROSS-REFERENCE TO RELATED APPLICATIONS

The present application claims the benefit of International Application No. PCT/JP2022/000609, filed on Jan. 11, 2022, the entire contents of which are hereby incorporated by reference.

BACKGROUND

1. Technical Field

The present disclosure relates to an electronic device manufacturing method, a laser device, and a wavelength sequence calculation system.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing laser device.

LIST OF DOCUMENTS

Patent Documents

Patent Document 1: US Patent Application Publication No. 2009/002666

SUMMARY

An electronic device manufacturing method according to an aspect of the present disclosure includes acquiring a pulse spectral shape of pulse laser light, and a target integrated spectral shape to be realized by the pulse laser light of a plurality of pulses generated based on wavelength sequence in which a center wavelength of the pulse laser light is periodically changed; calculating a plurality of target center wavelengths allocated to the plurality of pulses to realize the target integrated spectral shape, and a number of allocation pulses target center wavelength being the number of allocation pulses per cycle of the wavelength sequence; calculating the wavelength sequence by correspondingly allocating at least one first center wavelength having the number of allocation pulses of 2 or greater among the target center wavelengths so that the smaller the number of allocation pulses is, the larger a time interval of the allocation pulses for the first center wavelength is, and then correspondingly allocating at least one second center wavelength having the number of allocation pulses of 1 among the target center wavelengths; generating the pulse laser light based on the wavelength sequence by a laser device; outputting the pulse laser light to an exposure apparatus; and exposing a photosensitive substrate to the pulse laser light in the exposure apparatus to manufacture an electronic device.

A laser device according to another aspect of the present disclosure includes a laser oscillator capable of changing a center wavelength of pulse laser light, a laser amplifier capable of amplifying a pulse energy of the pulse laser light output from the laser oscillator and outputting the pulse laser light, and a processor. The processor is configured to acquire a pulse spectral shape of the pulse laser light, and a target integrated spectral shape to be realized by the pulse laser light of a plurality of pulses generated based on wavelength sequence in which a center wavelength of the pulse laser light is periodically changed; calculate a plurality of target center wavelengths allocated to the plurality of pulses to realize the target integrated spectral shape, and a number of allocation pulses of each target center wavelength being the number of allocation pulses per cycle of the wavelength sequence; calculate the wavelength sequence by correspondingly allocating at least one first center wavelength having the number of allocation pulses of 2 or greater among the target center wavelengths so that the smaller the number of allocation pulses is, the larger a time interval of the allocation pulses for the first center wavelength is, and then correspondingly allocate at least one second center wavelength having the number of allocation pulses of 1 among the target center wavelengths; and control the laser oscillator based on the wavelength sequence.

A wavelength sequence calculation system according to another aspect of the present disclosure includes a non-transitory storage medium readable by a computer which stores a wavelength sequence calculation program, and a CPU. The CPU is configured to execute the wavelength sequence calculation program to acquire a pulse spectral shape of pulse laser light, and a target integrated spectral shape to be realized by the pulse laser light of a plurality of pulses generated based on wavelength sequence in which a center wavelength of the pulse laser light is periodically changed; calculate a plurality of target center wavelengths allocated to the plurality of pulses to realize the target integrated spectral shape, and a number of allocation pulses of each target center wavelength being the number of allocation pulses per cycle of the wavelength sequence; and calculate the wavelength sequence by correspondingly allocating at least one first center wavelength having the number of allocation pulses of 2 or greater among the target center wavelengths so that the smaller the number of allocation pulses is, the larger a time interval of the allocation pulses for the first center wavelength is, and then correspondingly allocate at least one second center wavelength having the number of allocation pulses of 1 among the target center wavelengths.

BRIEF DESCRIPTION OF THE DRAWINGS

Embodiments of the present disclosure will be described below merely as examples with reference to the accompanying drawings.

FIG. 1 schematically shows the configuration of a lithography system of a comparative example.

FIG. 6 shows an example of wavelength sequence in multiple-wavelength oscillation.

FIG. 7 shows an integrated spectral shape sought to be obtained by the wavelength sequence shown in FIG. 6.

FIG. 8 shows, in time series, target center wavelengths set based on the wavelength sequence shown in FIG. 6.

FIG. 9 shows the breakdown of the target center wavelengths of the pulse laser light of the number of N slit pulses Ns radiated over a required time T.

FIG. 12 schematically shows the configuration of a semiconductor laser of the first embodiment.

FIG. 15 is a flowchart showing details of processing in which the exposure control processor calculates the target center wavelength and a number of allocation pulses.

FIG. 19 is a flowchart showing a modification of processing in which the exposure control processor calculates the target center wavelength and the number of allocation pulses.

FIG. 20 is a flowchart showing details of processing in which the exposure control processor calculates the wavelength sequence.

FIG. 21 shows the wavelength sequence before improvement calculated without applying processes of S32 to S34 of FIG. 20.

FIG. 22 shows a state in which the target center wavelengths having the number of allocation pulses of 2 or greater are allocated to several pulses included in the wavelength sequence in S33 of FIG. 20.

FIG. 23 shows the wavelength sequence after improvement in which the target center wavelengths having the number of allocation pulses of 1 are allocated to remaining pulses included in the wavelength sequence in S34 of FIG. 20.

DESCRIPTION OF EMBODIMENTS

Contents

Figure 2:
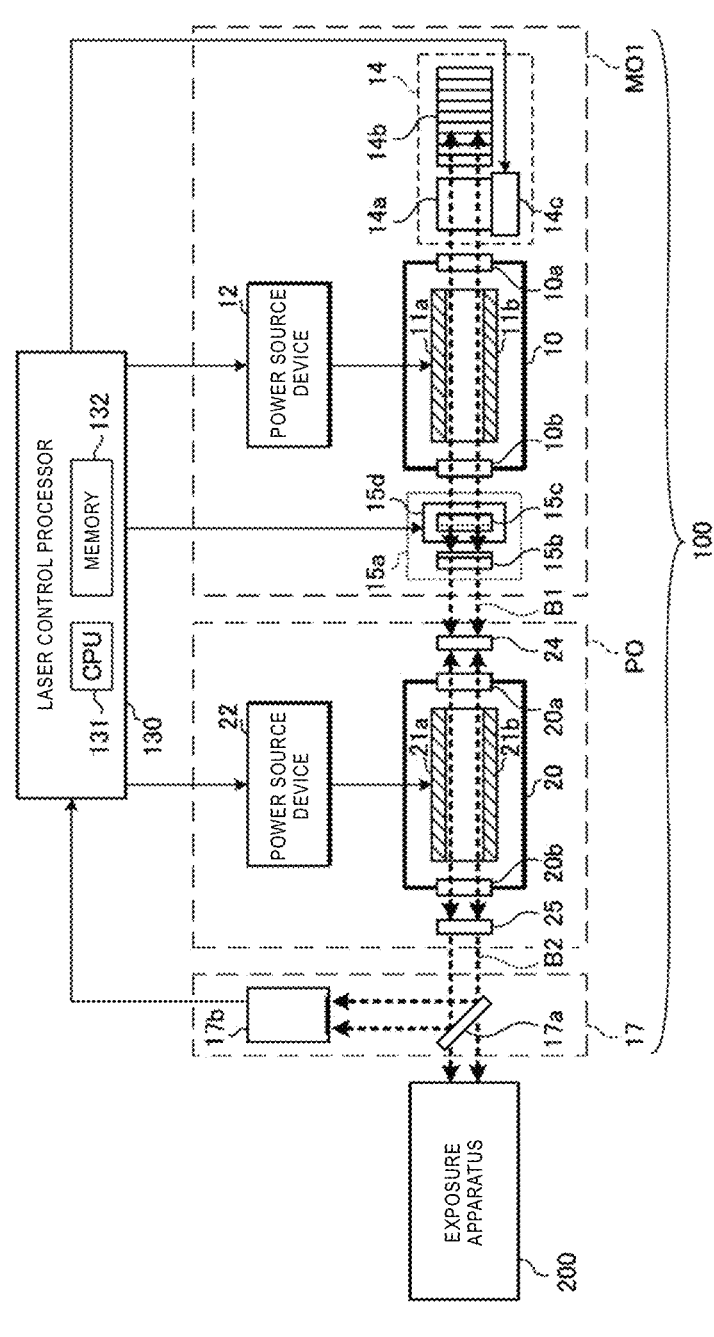
FIG. 2 schematically shows the configuration of a laser device of the comparative example.

1. Comparative example
  1.1 Lithography system
  1.2 Exposure apparatus 200
    1.2.1 Configuration
    1.2.2 Operation
  1.3 Laser device 100
    1.3.1 Configuration
    1.3.2 Operation
  1.4 Scan exposure
  1.5 Multiple-wavelength oscillation
  1.6 Problem of comparative example
2. Calculation method of wavelength sequence in which each target center wavelength is allocated to plurality of pulses so that time interval therebetween is large
  2.1 Configuration
  2.2 Operation
  2.3 Semiconductor laser 60
    2.3.1 Configuration
    2.3.2 Operation
  2.4 Calculation of wavelength sequence based on target integrated spectral shape s
    2.4.1 Main flow
    2.4.2 Transmission of pulse spectral shape g
    2.4.3 Calculation of target center wavelength $\lambda i$ and number of allocation pulses Ji
    2.4.4 Calculation of wavelength sequence
  2.5 Effect
3. Embodiment in which exposure control processor 210 transmits wavelength sequence to laser control processor 130
  3.1 Configuration
  3.2 Calculation of wavelength sequence based on target integrated spectral shape s
  3.3 Effect
4. Embodiment in which laser control processor 130 calculates wavelength sequence
  4.1 Configuration
  4.2 Calculation of wavelength sequence based on target integrated spectral shape s
  4.3 Effect
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. COMPARATIVE EXAMPLE

1.1 Lithography System

Figure 1:
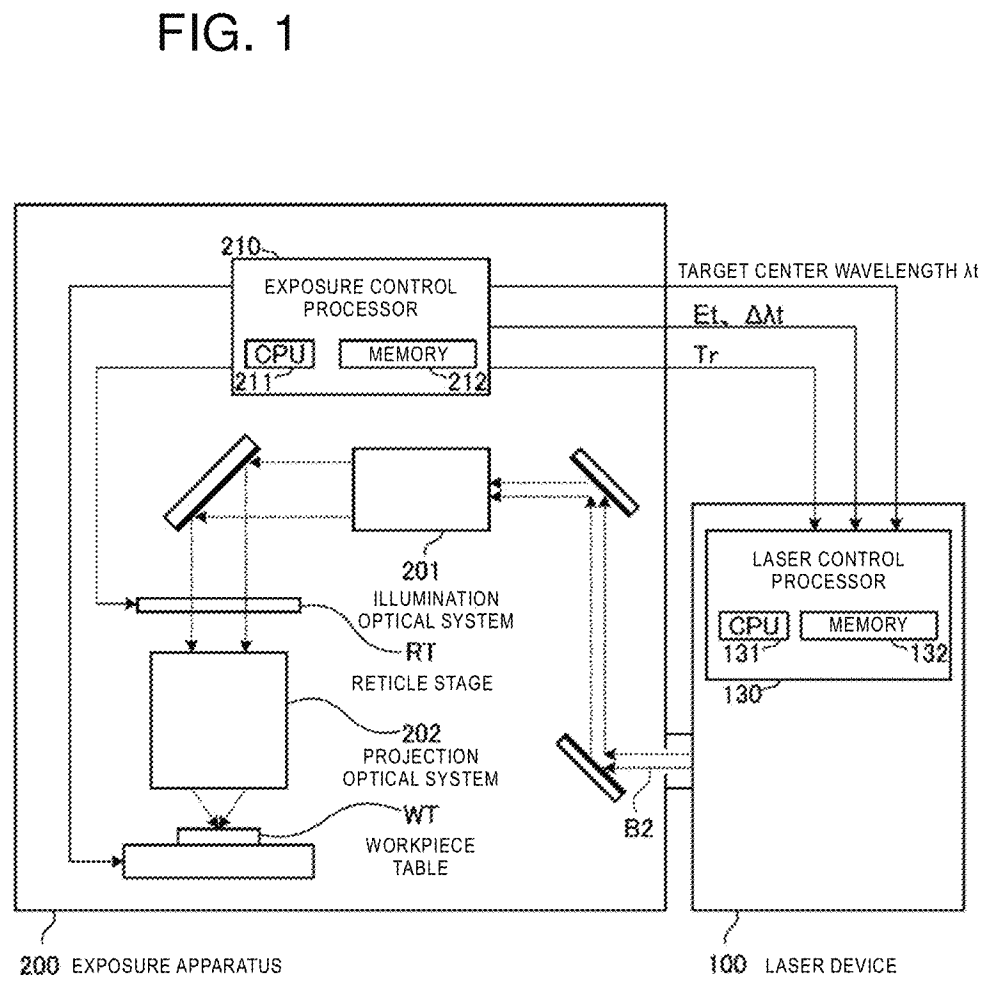

FIG. 1 schematically shows the configuration of a lithography system of a comparative example. The comparative example of the present disclosure is an example recognized by the applicant as known only by the applicant, and is not a publicly known example admitted by the applicant.

The lithography system includes a laser device 100 and an exposure apparatus 200. In FIG. 1, the laser device 100 is shown in a simplified manner.

The laser device 100 includes a laser control processor 130. The laser control processor 130 is a processing device including a memory 132 in which a control program is stored, and a central processing unit (CPU) 131 for executing the control program. The memory 132 includes a non-transitory computer-readable storage medium. The laser control processor 130 is specifically configured or programmed to perform various processes included in the present disclosure. The laser device 100 is configured to generate pulse laser light B2 and output the pulse laser light B2 toward an exposure apparatus 200.

1.2 Exposure Apparatus 200

1.2.1 Configuration

As shown in FIG. 1, the exposure apparatus 200 includes an illumination optical system 201, a projection optical system 202, and an exposure control processor 210.

The illumination optical system 201 illuminates a reticle pattern of a reticle (not shown) arranged on a reticle stage RT with the pulse laser light B2 incident from the laser device 100.

The projection optical system 202 causes the pulse laser light B2 transmitted through the reticle to be imaged as being reduced and projected on a workpiece (not shown) arranged on a workpiece table WT. The workpiece is a photosensitive substrate such as a semiconductor wafer on which a resist film is applied.

The exposure control processor 210 is a processing device including a memory 212 in which a control program is stored and a CPU 211 for executing the control program. The memory 212 includes a non-transitory computer-readable storage medium. The exposure control processor 210 is specifically configured or programmed to perform various processes included in the present disclosure. The exposure control processor 210 performs overall control of the exposure apparatus 200.

1.2.2 Operation

The exposure control processor 210 transmits a trigger signal Tr and various parameters including a target center wavelength λ, a target pulse energy Et, and a target spectral line width Δλt to the laser control processor 130. The laser control processor 130 controls the laser device 100 in accordance with these parameters and signals.

The exposure control processor 210 synchronously translates the reticle stage RT and the workpiece table WT in opposite directions to each other. Thus, the workpiece is exposed to the pulse laser light B2 reflecting the reticle pattern.

Through the exposure process as described above, the reticle pattern is transferred onto the semiconductor wafer. Thereafter, an electronic device can be manufactured through a plurality of processes.

1.3 Laser Device 100

1.3.1 Configuration

FIG. 2 schematically shows the configuration of the laser device 100 of the comparative example. In FIG. 2, the exposure apparatus 200 is shown in a simplified manner.

The laser device 100 includes a laser oscillator MO1, a laser amplifier PO, and a monitor module 17 in addition to the laser control processor 130. The laser oscillator MO1 and the laser amplifier PO each include an excimer laser.

The laser oscillator MO1 is a master oscillator which includes a laser chamber 10, a power source device 12, a line narrowing module 14, and a spectral line width adjuster 15a. The line narrowing module 14 and the spectral line width adjuster 15a configure a first optical resonator.

The laser chamber 10 is arranged on the optical path of the first optical resonator. The laser chamber 10 is provided with two windows 10a, 10b. The laser chamber 10 includes a pair of discharge electrodes 11a, 11b therein. The laser chamber 10 is filled with a laser gas containing, for example, an argon gas or a krypton gas as a rare gas, a fluorine gas as a halogen gas, a neon gas as a buffer gas, and the like.

The power source device 12 is connected to the discharge electrode 11a. The discharge electrode 11b is connected to the ground potential.

The line narrowing module 14 includes a prism 14a, a grating 14b, and a rotation stage 14c. The prism 14a is arranged on the optical path of a light beam output from the window 10a. The prism 14a is arranged such that the surface of the prism 14a on and from which the light beams are incident and output is parallel to the discharge direction between the discharge electrodes 11a, 11b. The rotation stage 14c includes a driver (not shown) connected to the laser control processor 130. The prism 14a is rotatable about an axis parallel to the discharge direction by the rotation stage 14c.

The grating 14b is arranged on the optical path of the light beam having transmitted through the prism 14a. The direction of grooves of the grating 14b is parallel to the discharge direction.

The spectral line width adjuster 15a includes a cylindrical plano-convex lens 15b, a cylindrical plano-concave lens 15c, and a linear stage 15d. The cylindrical plano-concave lens 15c is located between the laser chamber 10 and the cylindrical plano-convex lens 15b. The linear stage 15d includes a driver (not shown) connected to the laser control processor 130.

The cylindrical plano-convex lens 15b and the cylindrical plano-concave lens 15c are arranged such that the convex surface of the cylindrical plano-convex lens 15b and the concave surface of the cylindrical plano-concave lens 15c face each other. The convex surface of the cylindrical plano-convex lens 15b and the concave surface of the cylindrical plano-concave lens 15c each have a focal axis parallel to the discharge direction. The planar surface of the cylindrical plano-convex lens 15b opposite to the convex surface is coated with a partial reflection film.

The laser amplifier PO is arranged on the optical path of pulse laser light B1 output from the spectral line width adjuster 15a.

The laser amplifier PO is a power oscillator including a laser chamber 20, a power source device 22, a rear mirror 24, and an output coupling mirror 25. The rear mirror 24 and the output coupling mirror 25 configure a second optical resonator.

Each of the rear mirror 24 and the output coupling mirror 25 is configured by a partial reflection mirror. The rear mirror 24 has a higher reflectance than the output coupling mirror 25.

The laser chamber 20 is arranged on the optical path of the second optical resonator. The laser chamber 20 is provided with two windows 20a, 20b.

The laser chamber 20 includes a pair of discharge electrodes 21a, 21b therein. The laser gas enclosed in the laser chamber 20 is similar to that enclosed in the laser chamber 10.

The power source device 22 is connected to the discharge electrode 21a. The discharge electrode 21b is connected to the ground potential.

The monitor module 17 includes a beam splitter 17a and a beam monitor 17b. The beam splitter 17a is arranged on the optical path of the pulse laser light B2 output from the output coupling mirror 25. The beam monitor 17b is arranged on the optical path of the pulse laser light B2 reflected by the beam splitter 17a. The pulse laser light B2 transmitted through the beam splitter 17a is output to the exposure apparatus 200.

1.3.2 Operation

The laser control processor 130 transmits a control signal to the line narrowing module 14 based on the target wavelength λt received from the exposure control processor 210. The laser control processor 130 transmits a control signal to the spectral line width adjuster 15a based on the target spectral line width Δλt received from the exposure control processor 210. The laser control processor 130 transmits voltage command values to the power source devices 12, 22 of the laser oscillator MO1 and the laser amplifier PO, respectively, based on the target pulse energy Et received from the exposure control processor 210.

The laser control processor 130 transmits the oscillation trigger signal to the power source devices 12, 22 based on the trigger signal Tr received from the exposure control processor 210.

When receiving the oscillation trigger signal from the laser control processor 130, the power source device 12 of the laser oscillator MO1 applies a pulse high voltage corresponding to the voltage command value between the discharge electrodes 11a, 11b.

When the high voltage is applied between the discharge electrodes 11a, 11b, discharge occurs between the discharge electrodes 11a, 11b. The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is output to the outside of the laser chamber 10 through the windows 10a, 10b. The light output from the window 10a enters the line narrowing module 14. The beam width of the light entering the line narrowing module 14 is expanded by the prism 14a and is incident on the grating 14b.

The light incident on the grating 14b is reflected by a plurality of grooves of the grating 14b and is diffracted in a direction corresponding to the wavelength of the light. The prism 14a reduces the beam width of the diffracted light from the grating 14b and returns the light to the laser chamber 10 through the window 10a.

Thus, among the light having entered the line narrowing module 14, the light having a wavelength near a desired wavelength is returned to the laser chamber 10.

The spectral line width adjuster 15a transmits and outputs, as the pulse laser light B1, a part of the light output from the window 10b, and reflects the other part back into the laser chamber 10.

In this way, the light output from the laser chamber 10 reciprocates between the line narrowing module 14 and the spectral line width adjuster 15a. This light is amplified every time when passing through the discharge space in the laser chamber 10. Further, the light is line-narrowed every time when being turned back by the line narrowing module 14, and becomes light having a steep wavelength distribution with a part of a range of wavelength selected by the line narrowing module 14 as a center wavelength. Thus, the light having undergone laser oscillation and line narrowing is output as the pulse laser light B1 from the spectral line width adjuster 15a.

The laser control processor 130 controls the rotation stage 14c included in the line narrowing module 14 via the driver (not shown). In accordance with the rotation angle of the rotation stage 14c, the incident angle of the light beam incident on the grating 14b changes, and the wavelength selected by the line narrowing module 14 changes.

The laser control processor 130 controls the linear stage 15d included in the spectral line width adjuster 15a via the driver (not shown). In accordance with the distance between the cylindrical plano-convex lens 15b and the cylindrical plano-concave lens 15c, the wavefront of the light traveling from the spectral line width adjuster 15a to the line narrowing module 14 changes. As the wavefront changes, the spectral line width of the pulse laser light B1 changes.

The pulse laser light B1 output from the spectral line width adjuster 15a is guided to the rear mirror 24 of the laser amplifier PO.

When receiving the oscillation trigger signal from the laser control processor 130, the power source device 22 of the laser amplifier PO applies a pulse high voltage corresponding to the voltage command value between the discharge electrodes 21a, 21b. A delay time of the oscillation trigger signal for the laser amplifier PO with respect to the oscillation trigger signal for the laser oscillator MO1 is set so that the timing at which the discharge occurs between the discharge electrodes 21a, 21b and the timing at which the pulse laser light B1 enters the laser chamber 20 through the rear mirror 24 and the window 20a are synchronized with each other.

The pulse laser light B1 having entered the laser chamber 20 reciprocates between the rear mirror 24 and the output coupling mirror 25, and the pulse energy thereof is amplified each time it passes through the discharge space between the discharge electrodes 21a, 21b. The amplified light is output from the output coupling mirror 25 of the laser amplifier PO as the pulse laser light B2.

The beam monitor 17b measures the wavelength of the pulse laser light B2 and transmits the measured wavelength to the laser control processor 130. The laser control processor 130 performs feedback control on the rotation stage 14c based on the target center wavelength λt received from the exposure control processor 210 and the measured wavelength. Further, the laser control processor 130 can change the center wavelength of each of the pulse laser light B1 output from the laser oscillator MO1 and the pulse laser light B2 output from the laser amplifier PO for each pulse by controlling the rotation stage 14c even in a case in which the target center wavelength λt changes for each pulse.

The beam monitor 17b measures the spectral line width of the pulse laser light B2 and transmits the measured spectral line width to the laser control processor 130. The laser control processor 130 performs feedback control on the linear stage 15d based on the target spectral line width Δλt received from the exposure control processor 210 and the measured spectral line width.

The beam monitor 17b measures the pulse energy of the pulse laser light B2 and transmits the measured pulse energy to the laser control processor 130. The laser control processor 130 performs feedback control on the voltage command value set for the power source devices 12, 22 based on the target pulse energy Et received from the exposure control processor 210 and the measured pulse energy. The pulse laser light B2 transmitted through the beam splitter 17a enters the exposure apparatus 200.

1.4 Scan Exposure

Figure 3:
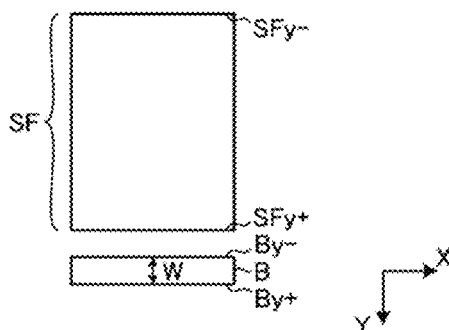
FIG. 3 is a diagram for explaining how the position of a scan field changes with respect to the position of a beam cross section of pulse laser light in an exposure apparatus.
Figure 4:
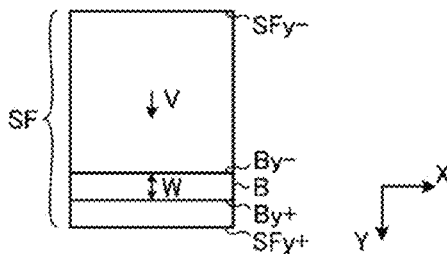
FIG. 4 is a diagram for explaining how the position of the scan field changes with respect to the position of the beam cross section of the pulse laser light in the exposure apparatus.
Figure 5:
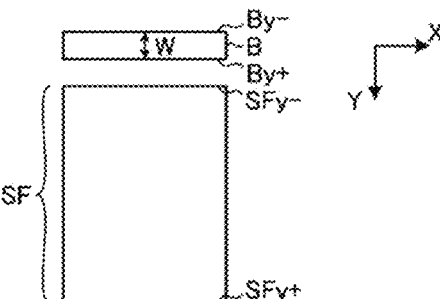
FIG. 5 is a diagram for explaining how the position of the scan field changes with respect to the position of the beam cross section of the pulse laser light in the exposure apparatus.

FIGS. 3 to 5 show how the position of a scan field SF changes with respect to the position of a beam cross section B of the pulse laser light B2 in the exposure apparatus 200. The scan field SF corresponds to, for example, a region where several semiconductor chips among a large number of semiconductor chips to be formed in a workpiece are formed. A resist film is applied to the scan field SF. A movement direction of the scan field SF is represented by a Y-axis direction, and a direction perpendicular to the Y-axis direction in a plane of the scan field SF is represented by an X-axis direction. The width of the scan field SF in the X-axis direction is the same as the width of the beam cross section B of the pulse laser light B2 in the X-axis direction at the position of the workpiece. The width of the scan field SF in the Y-axis direction is larger than a width W of the beam cross section B of the pulse laser light B2 in the Y-axis direction at the position of the workpiece.

The procedure of exposing the scan field SF with the pulse laser light B2 is performed in the order of FIGS. 3, 4, and 5. First, as shown in FIG. 3, the workpiece table WT is positioned so that the position of an end SFy+ of the scan field SF in the +Y direction is spaced apart by a predetermined distance in the −Y direction with respect to the position of an end By− of the beam cross section B in the −Y direction. Then, the workpiece table WT is accelerated in the +Y direction. The velocity of the workpiece table WT becomes V by the time when the end SFy+ of the scan field SF in the +Y direction coincides with the position of the end By− of the beam cross section B in the −Y direction. As shown in FIG. 4, exposure of the scan field SF is performed while the workpiece table WT is moved such that the position of the scan field SF moves linearly at the constant velocity V with respect to the position of the beam cross section B. As shown in FIG. 5, when the workpiece table WT is moved until the position of the end By+ of the beam cross section B in the +Y direction passes the end SFy− of the scan field SF in the −Y direction, the exposure of the scan field SF is completed. In this way, the exposure is performed while the scan field SF moves with respect to the position of the beam cross section B.

The required time T for the scan field SF to move by the distance corresponding to the width W of the beam cross section B of the pulse laser light B2 at the velocity V is obtained as follows.

$$T=W/V$$

The number of irradiation pulses N of the pulse laser light B2 radiated to any one location of the scan field SF is referred to as the number of N slit pulses Ns, is the same as the number of pulses of the pulse laser light B2 generated in the required time T, and is obtained as follows.

$$Ns=F{\cdot}T$$

Here, F is the repetition frequency of the pulse laser light B2.

1.5 Multiple-Wavelength Oscillation

FIG. 6 shows an example of wavelength sequence in multiple-wavelength oscillation.

Each of t1 to t5 indicates an output timing of one pulse of the pulse laser light B2, and t1 to t5 are repeated in accordance with passage of time in the order of t1, t2, t3, t4, t5, t1, t2, t3, . . . . Assuming that the number of pulses corresponding to one cycle of the wavelength sequence is a number of in-cycle pulses Kmax and each integer of 1 to Kmax is k, the number of in-cycle pulses Kmax is 5 in FIG. 6, and the output timings t1 to t5 can be collectively represented by tk.

It is assumed that each of λ1 to λ3 indicates the target center wavelength of one pulse of the pulse laser light B2 allocated to each of the pulses included in the wavelength sequence, and the wavelength increases in the order of λ1, λ2, and λ3. Assuming that the number of target center wavelengths included in the wavelength sequence is Imax and each integer of 1 to Imax is i, Imax is 3 in FIG. 6, and the target center wavelengths λ1 to λ3 can be collectively represented by λi.

The wavelength sequence includes columns that identify each of the output timings t1 to t5 and rows that identify each of the target center wavelengths λ1 to λ3. "1" or "0" is filled in each of the fields identified by these columns and rows. "1" indicates that the pulse laser light B2 with the target center wavelength corresponding to the row is output at the output timing corresponding to the column. Only one of the target center wavelengths is set in each of the output timings t1 to t5, and "1" is solely filled in the column identified in each of the output timings t1 to t5. Fields other than the fields filled with "1" are filled with "0".

From the above, the wavelength sequence of FIG. 6 defines that the center wavelength of the pulse laser light B2 is changed periodically by setting the target center wavelength to λ1, λ1, λ2, λ3, λ3, λ1, λ1, λ2, . . . at the output timings t1, t2, t3, t4, t5, t1, t2, t3, . . . , respectively.

FIG. 7 shows an integrated spectral shape sought to be obtained by the wavelength sequence shown in FIG. 6. The integrated spectral shape is a spectral shape obtained by integrating pulse spectral shapes of the pulses over the number of N slit pulses Ns while periodically changing target center wavelength of the pulse laser light B2 and radiating the pulse laser light B2 of the number of N slit pulses Ns at one location. FIG. 7 shows the integrated spectral shape, having three peaks corresponding to the target center wavelengths λ1 to λ3, in which the peak intensities at the target center wavelengths λ1, λ3 are higher than the peak intensity at the target center wavelength λ2. To obtain the integrated spectral shape as shown in FIG. 7, it is conceivable, as shown in FIG. 6, to set the number of pulses having the target center wavelength of λ1 and the number of pulses having the target center wavelength of λ3 to be larger than the number of pulses having the target center wavelength of λ2.

The focal length in the exposure apparatus 200 depends on the wavelength of the pulse laser light B2. The pulse laser light B2 entering the exposure apparatus 200 through multiple-wavelength oscillation can be focused at a plurality of different positions in the direction of the optical path axis of the pulse laser light B2, so that the focal depth can be substantially increased. For example, even when a resist film having a large thickness is exposed, the imaging performance in the thickness direction of the resist film can be maintained. By controlling the integrated spectral shape to a desired shape, the cross sectional shape of the developed resist film can be controlled.

1.6 Problem of Comparative Example

However, there is a case in which the integrated spectral shape as shown in FIG. 7 cannot be obtained even when the wavelength sequence shown in FIG. 6 is set. This is because, even when the number of N slit pulses Ns of the pulse laser light B2 radiated to one location of the scan field SF is constant, the breakdown of the target center wavelength of the pulse laser light B2 of the number of N slit pulses Ns may vary. This will be described with reference to FIGS. 8 and 9.

FIG. 8 shows, in time series, the target center wavelengths $\lambda 1$ to $\lambda 3$ set based on the wavelength sequence shown in FIG. 6. For example, the breakdown of the target center wavelength included in the pulse laser light B2 of the number of N slit pulses Ns radiated over the required time T from the output timing t1 can be acquired by counting the target center wavelengths $\lambda 1$, $\lambda 2$, $\lambda 3$ within the range of the arrow indicating the duration of the required time T starting from the output timing t1. The pulse laser light B2 radiated over the required time T from the outputting timing t1 includes five pulses having the target center wavelength of $\lambda 1$, two pulses having the target center wavelength of $\lambda 2$, and four pulses having the target center wavelength of $\lambda 3$.

FIG. 9 shows the breakdown of the target center wavelengths of the pulse laser light B2 of the number of N slit pulses Ns radiated over the required time T. As shown in FIG. 9, even when the required time T is started from any of the outputting timings t1 to t5, the number of N slit pulses Ns is constant at 11, but the breakdown of the target center wavelengths of the pulse laser light B2 radiated over the required time T varies. As described with reference to FIGS. 3 to 5, since exposure of the scan field SF is performed while the scan field SF moves with respect to the position of the beam cross section B, the integrated spectral shape differs depending on the position in the scan field SF.

As a method of keeping the integrated spectral shape constant without varying, it is conceivable to set the number of N slit pulses Ns to a multiple of the number of in-cycle pulses Kmax corresponding to one cycle of the wavelength sequence. However, to change the number of N slit pulses Ns, any one of the repetition frequency F of the pulse laser light B2, the velocity V at which the scan field SF is moved, and the width W of the beam cross section B of the pulse laser light B2 must be changed and accurate control is required. Conversely, it is conceivable to set the number of in-cycle pulses Kmax to a divisor of the number of N slit pulses Ns. However, when the selection range of the number of in-cycle pulses Kmax is narrowed, it may be difficult to calculate the wavelength sequence for obtaining a desired integrated spectral shape.

2. CALCULATION METHOD OF WAVELENGTH SEQUENCE IN WHICH EACH TARGET CENTER WAVELENGTH IS ALLOCATED TO PLURALITY OF PULSES SO THAT TIME INTERVAL THEREBETWEEN IS LARGE

2.1 Configuration

Figure 10:
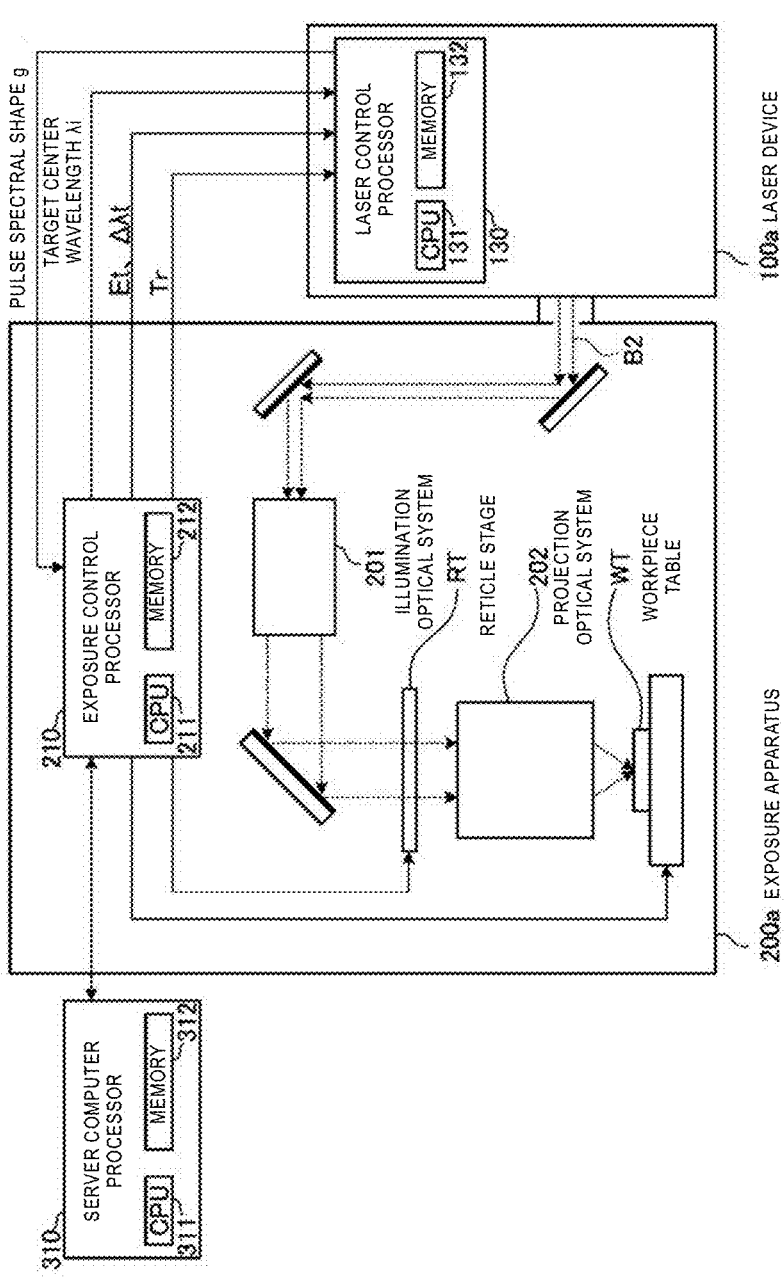
FIG. 10 schematically shows the configuration of the lithography system of a first embodiment.

FIG. 10 schematically shows the configuration of the lithography system of a first embodiment. In the first embodiment, the laser control processor 130 included in the laser device 100a transmits a pulse spectral shape g of the pulse laser light B2 to the exposure control processor 210 included in the exposure apparatus 200a. The exposure control processor 210 calculates the wavelength sequence and transmits a target center wavelength $\lambda i$ based on the wavelength sequence to the laser control processor 130 for each pulse. The exposure control processor 210 of the first embodiment corresponds to the wavelength sequence calculation system in the present disclosure.

The exposure control processor 210 may be connected to a server computer processor 310 external to the exposure apparatus 200a. The server computer processor 310 is a processing device including a memory 312 in which a control program is stored and a CPU 311 for executing the control program. The memory 312 includes a non-transitory computer-readable storage medium. The server computer processor 310 is specifically configured or programmed to perform various processes included in the present disclosure. In the following description, the processes (S2 and S3) of calculating the target center wavelength $\lambda i$, a number of allocation pulses Ji, and the wavelength sequence may be performed by the server computer processor 310 instead of the exposure control processor 210. In this case, the server computer processor 310 corresponds to the wavelength sequence calculation system in the present disclosure. When a part of S2 and S3 is performed by the exposure control processor 210 and another part thereof is performed by another processor, the combination of the processors corresponds to the wavelength sequence calculation system in the present disclosure.

Figure 11:
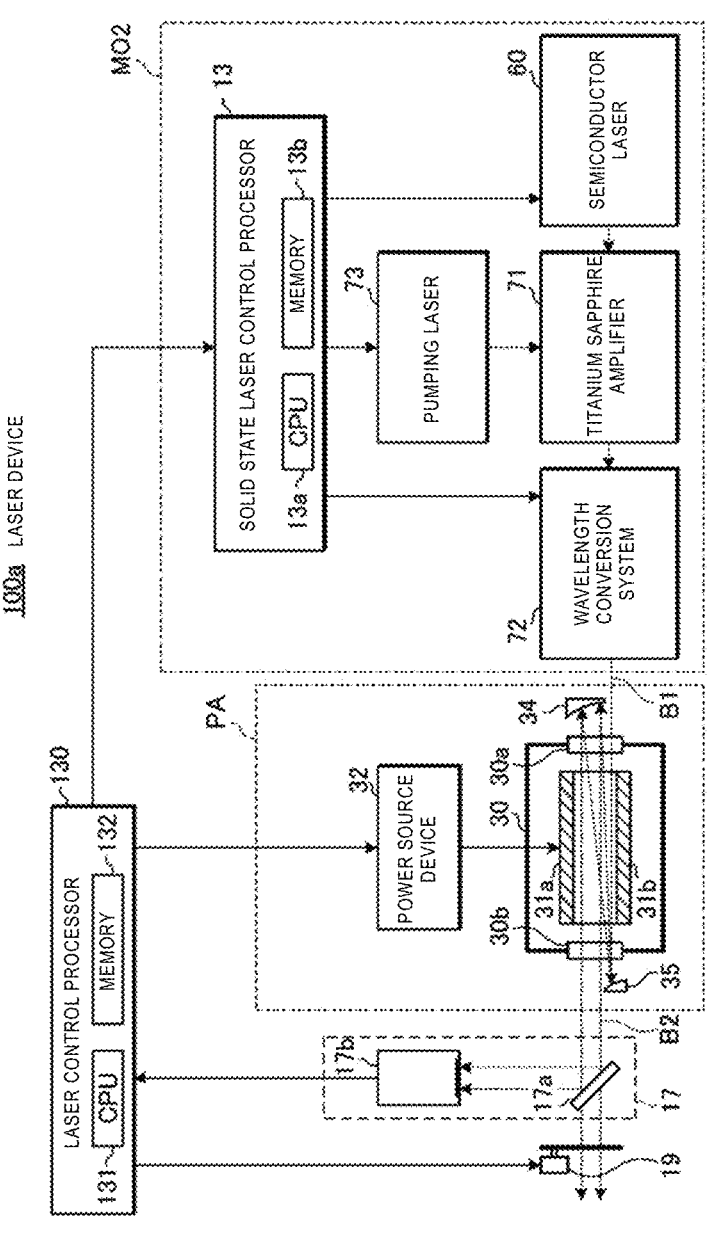
FIG. 11 schematically shows the configuration of the laser device of the first embodiment.

FIG. 11 schematically shows the configuration of the laser device 100a of the first embodiment. The laser device 100a includes a laser oscillator MO2, a laser amplifier PA, the monitor module 17, a shutter 19, and the laser control processor 130. The laser oscillator MO2 includes a solid state laser, and the laser amplifier PA includes an excimer laser. However, the laser device in the present disclosure is not limited to the laser device 100a shown in FIG. 11, and the laser device 100 shown in FIG. 2 may be used.

The laser oscillator MO2 includes a semiconductor laser 60, a titanium sapphire amplifier 71, a wavelength conversion system 72, a pumping laser 73, and a solid state laser control processor 13.

The semiconductor laser 60 is a laser system including a distributed feedback semiconductor laser DFB and a semiconductor optical amplifier SOA. Details of the semiconductor laser 60 will be described later with reference to FIG. 12.

The titanium sapphire amplifier 71 is an amplifier including a titanium sapphire crystal.

The pumping laser 73 is a laser device that outputs a second harmonic of yttrium lithium fluoride (YLF) laser to excite the titanium sapphire crystal of the titanium sapphire amplifier 71.

The wavelength conversion system 72 is a system that includes a lithium triborate (LBO) crystal and a potassium beryllium fluoroborate (KBBF) crystal and outputs a fourth harmonic of incident light as the pulse laser light B1.

The solid state laser control processor 13 is a processing device including a memory 13b in which a control program is stored and a CPU 13a which executes the control program. The memory 13b includes a non-transitory computer-readable storage medium. The solid state laser control processor 13 is specifically configured or programmed to perform various processes included in the present disclosure. The solid state laser control processor 13 is configured to control the semiconductor laser 60, the wavelength conversion system 72, and the pumping laser 73 as being connected thereto, respectively.

The laser amplifier PA includes a laser chamber 30, a power source device 32, a concave mirror 34, and a convex mirror 35. The configuration of the laser chamber 30 and the power source device 32 included in the laser amplifier PA is similar to the configuration of the laser chamber 10 and the power source device 12 described with reference to FIG. 2 except that an argon gas is used as the rare gas. Here the reference numerals of the windows included in the laser chamber 30 are changed to 30a and 30b, and the reference numerals of the discharge electrodes are changed to 31a and 31b.

The convex mirror 35 is arranged on the optical path of the pulse laser light B1 having passed through the laser chamber 30 after being output from the laser oscillator MO2. The concave mirror 34 is arranged on the optical path of the pulse laser light B1 having passed through the laser chamber 30 again after being reflected by the convex mirror 35.

The configuration of the monitor module 17 and the laser control processor 130 is similar to the corresponding configuration in the laser device 100 described with reference to FIG. 2.

The shutter 19 is located on the optical path of the pulse laser light B2 transmitted through the monitor module 17. The shutter 19 is configured to be capable of switching between passage and blocking of the pulse laser light B2 to the exposure apparatus 200a.

2.2 Operation

In the laser oscillator MO2, the semiconductor laser 60 outputs pulse laser light having a wavelength of about 773.6 nm, and the titanium sapphire amplifier 71 amplifies and outputs the pulse laser light. The wavelength conversion system 72 converts the pulse laser light having the wavelength of about 773.6 nm into the pulse laser light B1 having a wavelength of about 193.4 nm, and outputs the pulse laser light B1 to the laser amplifier PA.

The pulse laser light B1 entering the laser amplifier PA passes through the discharge space in the laser chamber 30, is reflected by the convex mirror 35, and is given a beam spread angle corresponding to the curvature of the convex mirror 35. The pulse laser light B1 passes through the discharge space in the laser chamber 30 again.

The pulse laser light B1 having passed through the laser chamber 30 after being reflected by the convex mirror 35 is reflected by the concave mirror 34 to be returned to substantially parallel light. The pulse laser light B1 passes through the discharge space in the laser chamber 30 once more, passes through the monitor module 17 as the pulse laser light B2, and is output to the outside of the laser device 100a.

A high voltage is applied between the discharge electrodes 31a, 31b so that discharge starts at the discharge space in the laser chamber 30 when the pulse laser light B1 from the laser oscillator MO2 is incident on the window 30a of the laser chamber 30. The pulse laser light B1 is expanded in the beam width by the convex mirror 35 and the concave mirror 34, and the pulse energy thereof is amplified while the pulse laser light B1 passes through the discharge space three times. The amplified light is output from the window 30b of the laser amplifier PA as the pulse laser light B2.

2.3 Semiconductor Laser 60

2.3.1 Configuration

Figure 12:
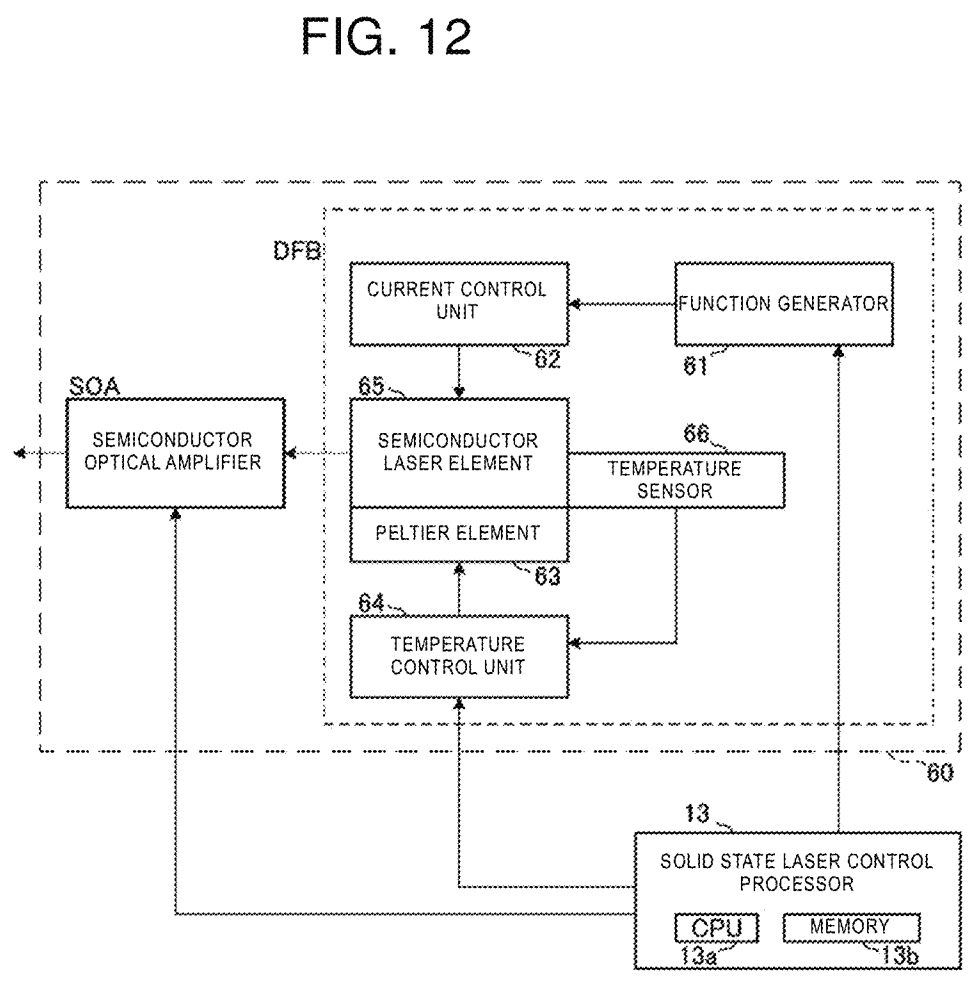

FIG. 12 schematically shows the configuration of the semiconductor laser 60 of the first embodiment. The semiconductor laser 60 includes a distributed feedback semiconductor laser DFB and a semiconductor optical amplifier SOA.

The distributed feedback semiconductor laser DFB includes a function generator 61, a current control unit 62, a Peltier element 63, a temperature control unit 64, a semiconductor laser element 65, and a temperature sensor 66.

The semiconductor laser element 65 is a laser element capable of changing an oscillation wavelength by the temperature or a current value. The current control unit 62 is connected to the semiconductor laser element 65. Further, the Peltier element 63 and the temperature sensor 66 are fixed to the semiconductor laser element 65. The temperature control unit 64 is connected to the Peltier element 63 and the temperature sensor 66. The current control unit 62 corresponds to the wavelength adjuster in the present disclosure.

2.3.2 Operation

The semiconductor laser element 65 outputs continuous wave (CW) laser light having the wavelength of about 773.6 nm.

The temperature control unit 64 supplies a current to the Peltier element 63 in accordance with the set temperature output from the solid state laser control processor 13. The Peltier element 63 cools or heats the semiconductor laser element 65 by moving the thermal energy in a direction from one surface of the Peltier element 63 toward the other surface thereof in accordance with the current supplied from the temperature control unit 64. The temperature sensor 66 detects the temperature of the semiconductor laser element 65. The temperature control unit 64 performs feedback control on the current to be supplied to the Peltier element 63 based on the set temperature output from the solid state laser control processor 13 and the temperature detected by the temperature sensor 66. By controlling the semiconductor laser element 65 to the set temperature, the wavelength of the CW laser light output from the semiconductor laser element 65 can be maintained at around 773.6 nm.

The function generator 61 generates an electric signal having a periodic waveform in accordance with a control signal output from the solid state laser control processor 13. The current control unit 62 periodically changes the current to be supplied to the semiconductor laser element 65 in accordance with the waveform of the electric signal generated by the function generator 61. As a result, the wavelength of the CW laser light output from the semiconductor laser element 65 periodically changes.

The semiconductor optical amplifier SOA amplifies the CW laser light output from the semiconductor laser element 65 in a pulse shape, and outputs the pulse laser light toward the titanium sapphire amplifier 71. By the current supplied to the semiconductor laser element 65, the center wavelength of each of the pulse laser light B1 output from the laser oscillator MO2 and the pulse laser light B2 output from the laser amplifier PA can be changed for each pulse.

Figure 13:
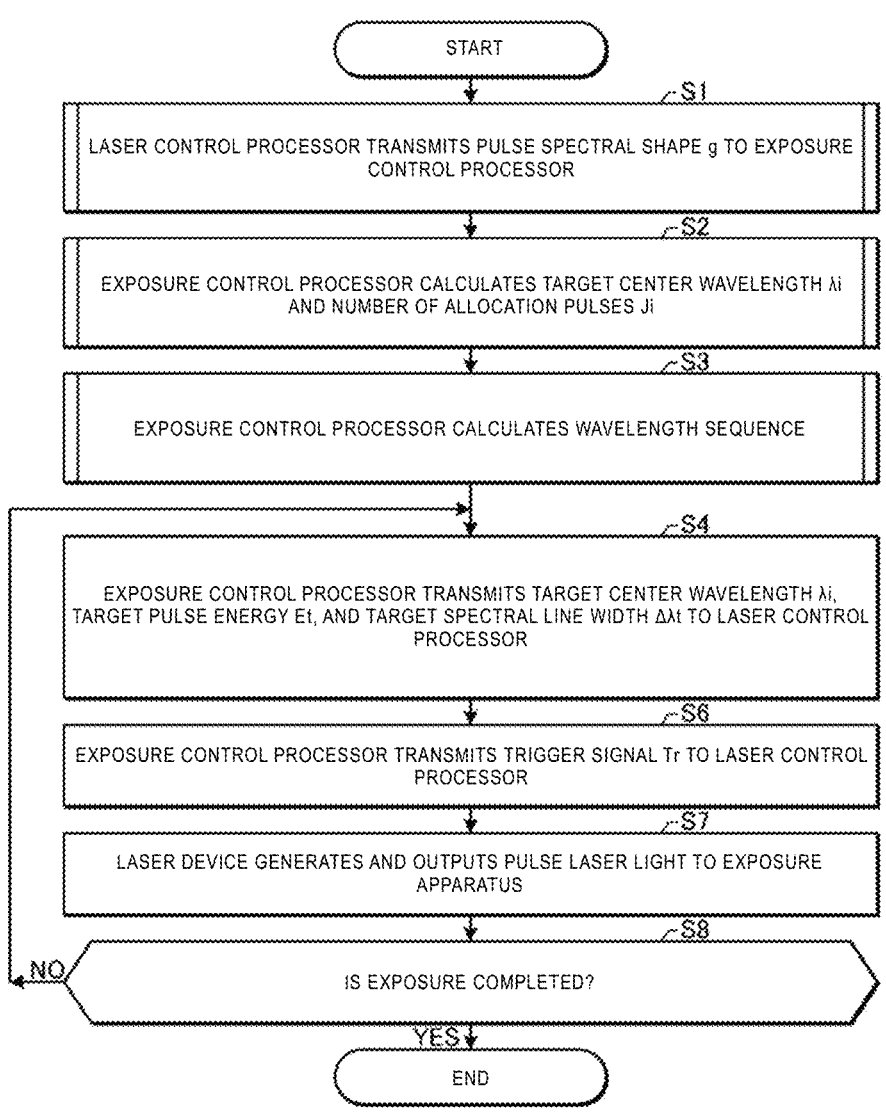
FIG. 13 is a flowchart showing the procedure of calculating the wavelength sequence based on a target integrated spectral shape in the first embodiment.

2.4 Calculation of Wavelength Sequence Based on Target Integrated Spectral Shape s 2.4.1 Main Flow FIG. 13 is a flowchart showing the procedure of calculating the wavelength sequence based on a target integrated spectral shape s in the first embodiment. The processes shown in FIG. 13 are mainly performed by the exposure control processor 210 included in the exposure apparatus 200$a$, and some processes are performed by the laser control processor 130 included in the laser device 100$a$.

In S1, the laser control processor 130 transmits the pulse spectral shape g to the exposure control processor 210. The pulse spectral shape g is a spectral shape of one pulse of the pulse laser light B2 output from the laser device 100$a$, and a specific example thereof will be described with reference to FIG. 17. Details of the process of S1 will be described with reference to FIG. 14.

In S2, the exposure control processor 210 calculates the target center wavelength $\lambda i$ and the number of allocation pulses Ji. The target center wavelength $\lambda i$ indicates the wavelength allocated to each of the pulses included in the wavelength sequence to realize the target integrated spectral shape s. The number of allocation pulses Ji is the number of pulses of each target center wavelength $\lambda i$ per cycle of the wavelength sequence. Details of the process of S2 will be described with reference to FIGS. 15 to 18.

In S3, the exposure control processor 210 calculates the wavelength sequence. Details of the process of S3 will be described with reference to FIGS. 20 to 23.

In S4, the exposure control processor 210 transmits the target center wavelength $\lambda i$ to the laser control processor 130 for each pulse based on the wavelength sequence. Further, the exposure control processor 210 transmits the target pulse energy Et and the target spectral line width $\Delta \lambda t$ to the laser control processor 130.

In S6, the exposure control processor 210 transmits the trigger signal Tr to the laser control processor 130.

In S7, the laser control processor 130 controls the laser device 100$a$ to generate and output the pulse laser light B2 to the exposure apparatus 200$a$ in accordance with the target center wavelength $\lambda i$, the target pulse energy Et, the target spectral line width $\Delta \lambda t$, and the trigger signal Tr.

In S8, the exposure control processor 210 determines whether or not the exposure is completed. For example, when the exposure of one semiconductor wafer is completed and the target integrated spectral shape s is changed, it is determined that the exposure is completed. When the exposure is not completed (S8: NO), processing returns to S4. When the exposure is completed (S8: YES), processing of the present flowchart ends.

2.4.2 Transmission of Pulse Spectral Shape g

Figure 14:
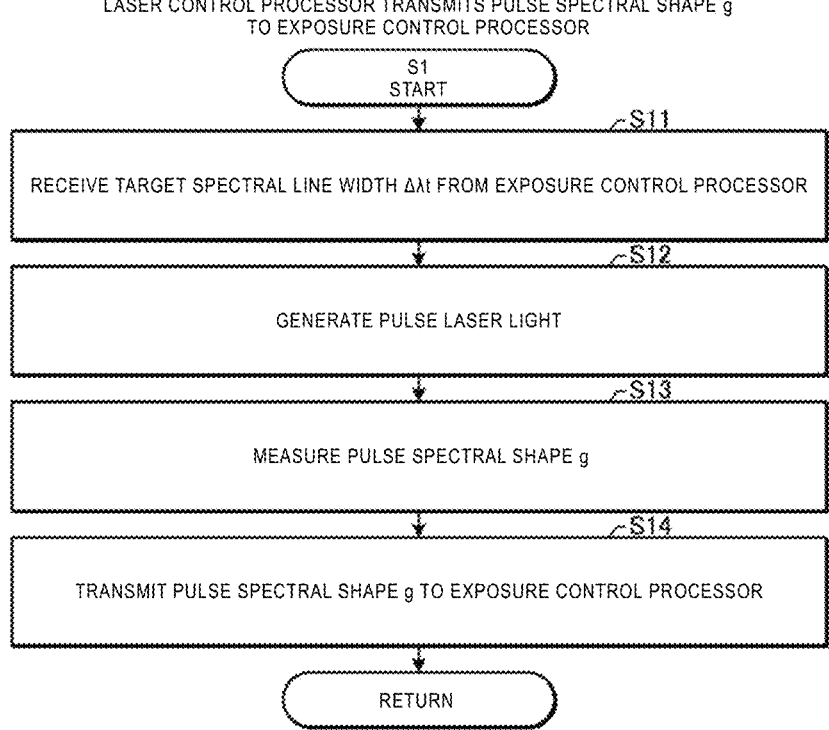
FIG. 14 is a flowchart showing details of processing in which a laser control processor transmits a pulse spectral shape to an exposure control processor.

FIG. 14 is a flowchart showing details of processing in which the laser control processor 130 transmits the pulse spectral shape g to the exposure control processor 210. The processes shown in FIG. 14 correspond to the subroutine of S1 of FIG. 13.

In S11, the laser control processor 130 receives the target spectral line width $\Delta \lambda t$ from the exposure control processor 210. The received target spectral line width $\Delta \lambda t$ is the target spectral line width of the pulse laser light B2 to be generated to measure the pulse spectral shape g. The received target spectral line width $\Delta \lambda t$ is stored in the memory 132.

In S12, the laser control processor 130 controls the laser device 100$a$ to generate the pulse laser light B2 in accordance with the target spectral line width $\Delta \lambda t$. At this time, the shutter 19 may be closed.

In S13, the laser control processor 130 measures the pulse spectral shape g of the pulse laser light B2 by the monitor module 17. The monitor module 17 in this case corresponds to the spectrum detector in the present disclosure.

In S14, the laser control processor 130 transmits the measured pulse spectral shape g to the exposure control processor 210.

After S14, processing of the present flowchart ends, and returns to processing shown in FIG. 13.

In FIG. 14, description has been provided on the case in which the pulse spectral shape g is acquired by the monitor module 1, but the present disclosure is not limited thereto.

(a) The laser control processor 130 may acquire the pulse spectral shape g by reading data of the reference spectral shape being the reference for the pulse spectral shape g and the target spectral line width $\Delta \lambda t$ from the memory 132 and deforming the reference spectral shape based on the target spectral line width $\Delta \lambda t$. The reference spectral shape is, for example, a Gaussian spectral shape.

(b) Further, the laser control processor 130 may acquire the pulse spectral shape g by reading, from the memory 132, data of the spectral shape of the pulse laser light output from a laser device different from the laser device 100$a$. The different laser device is, for example, a laser device of the same type. Further, the average of the spectral shapes of the pulse laser light output from a plurality of laser devices of the same type may be acquired as the pulse spectral shape g.

In S1 of FIG. 13 and FIG. 14, description has been provided on the case in which the laser control processor 130 transmits the pulse spectral shape g to the exposure control processor 210, but the present disclosure is not limited thereto. In (a) or (b) above, instead of the laser control processor 130, the exposure control processor 210 may read necessary data from the memory 212 to acquire the pulse spectral shape g. Further, when a monitor module (not shown) is provided in the exposure apparatus 200$a$, the pulse spectral shape g may be measured by the monitor module in the exposure apparatus 200$a$ while the pulse laser light B2 is output to the exposure apparatus 200$a$.

2.4.3 Calculation of Target Center Wavelength $\lambda i$ and Number of Allocation Pulses Ji FIG. 15 is a flowchart showing details of processing in which the exposure control processor 210 calculates the target center wavelength $\lambda i$ and the number of allocation pulses Ji. The processes shown in FIG. 15 correspond to the subroutine of S2 of FIG. 13.

In S21, the exposure control processor 210 acquires the target integrated spectral shape s and the pulse spectral shape g. The target integrated spectral shape s may be stored in the memory 212.

Figures 16, 17, 18:
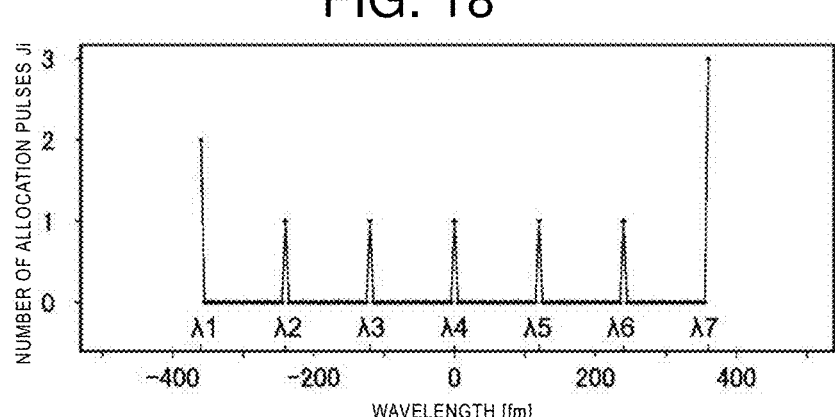
FIG. 16 shows an example of the target integrated spectral shape.
FIG. 17 shows an example of the pulse spectral shape.
FIG. 18 shows the result of, among the values included in a function pm, converting values less than 1 to 0 and rounding off values equal to or greater than 1.

FIG. 16 shows an example of the target integrated spectral shape s, and FIG. 17 shows an example of the pulse spectral shape g. In these figures, the horizontal axis represents the wavelength by the deviation when the reference wavelength is 0, and the vertical axis represents the light intensity by the ratio when the peak value is 1. Since the pulse spectral shape g and the target integrated spectral shape s define the light intensity for each wavelength component, they can be regarded as functions of the wavelength and correspond to the first and second functions in the present disclosure, respectively.

Referring back to FIG. 15, in S22, the exposure control processor 210 calculates Fourier transforms S, G of the target integrated spectral shape s and the pulse spectral shape g, respectively, as follows.

$$S = F(s)$$

$$G = F(g)$$

F(a) represents the Fourier transform of a function a.

In S23, the exposure control processor 210 calculates an inverse Fourier transform p of S/G obtained by dividing the Fourier transform S by the Fourier transform G as follows.

$$p = F^{-1}(S/G)$$

$F^{-1}(A)$ represents the inverse Fourier transform of a function A. S/G corresponds to the third function in the present disclosure.

It is desirable that the Fourier transform and the inverse Fourier transform are calculated by fast Fourier transform (FFT) and inverse fast Fourier transform (IFFT), respectively. The inverse Fourier transform p includes a value for each of the discrete wavelength components.

In S25, the exposure control processor 210 acquires a minimum value pmin that is equal to or greater than a first threshold among values included in the inverse Fourier transform p.

In S26, the exposure control processor 210 calculates a function pm by dividing the inverse Fourier transform p by the value pmin as follows.

$$pm = p/pmin$$

The function pm corresponds to the fourth function in the present disclosure.

In S27, the exposure control processor 210 converts the values included in the function pm into integers. Specifically, among the values included in the function pm, a value less than 1 is converted to 0, and a value equal to or greater than 1 is rounded off to a nearest integer.

In S28, among the values included in the function pm, the exposure control processor 210 sets the wavelength corresponding to each value equal to or greater than 1 as the target center wavelength $\lambda i$, and sets each value obtained in S27 by rounding off as the number of allocation pulses Ji.

FIG. 18 shows the result of, among the values included in the function pm, converting a value less than 1 to 0 and rounding off a value equal to or greater than 1. The horizontal axis represents the wavelength by the deviation when the reference wavelength is 0, and the vertical axis represents the number of allocation pulses Ji obtained by converting the values included in the function pm into integers. In FIG. 18, a number of allocation pulses J1 of the target center wavelength $\lambda 1$ is 2, each of numbers of allocation pulses J2 to J6 of the target center wavelengths $\lambda 2$ to $\lambda 6$ is 1, and a number of allocation pulses J7 of a target center wavelength $\lambda 7$ is 3.

As described above, the target center wavelength $\lambda i$ and the number of allocation pulses Ji are calculated.

After S28, processing of the present flowchart ends, and returns to processing shown in FIG. 13.

FIG. 19 is a flowchart showing a modification of processing in which the exposure control processor 210 calculates the target center wavelength $\lambda i$ and the number of allocation pulses Ji. The processes shown in FIG. 19 differ from the processes shown in FIG. 15 in that S24a is added after S23 and S25a to S28a are performed instead of S25 to S28.

In S24a, the exposure control processor 210 acquires a normalized inverse Fourier transform pn by normalizing the inverse Fourier transform p so that the maximum value is 1. Specifically, each value included in the inverse Fourier transform p is divided by the maximum value thereof. The normalized inverse Fourier transform pn corresponds to the fifth function in the present disclosure.

In S25a, the exposure control processor 210 acquires a minimum value pmin that is equal to or greater than a second threshold among values included in the normalized inverse Fourier transform pn. The second threshold value is preferably 0.1 or more and 0.2 or less.

In S26a, the exposure control processor 210 calculates a function pnm by dividing the normalized inverse Fourier transform pn by the value pmin as follows.

$$pnm = pn/pnmin$$

The function pnm corresponds to the sixth function in the present disclosure.

In S27a, the exposure control processor 210 converts the values included in the function pnm into integers. Specifically, among the values included in the function pnm, a value less than 1 is converted to 0, and a value equal to or greater than 1 is rounded off to a nearest integer.

In S28a, among the values included in the function pnm, the exposure control processor 210 sets the wavelength corresponding to each value equal to or greater than 1 as the target center wavelength $\lambda i$, and sets each value obtained in S27a by rounding off as the number of allocation pulses Ji.

After S28a, processing of the present flowchart ends, and returns to processing shown in FIG. 13.

In other respects, the processes shown in FIG. 19 are similar to those of FIG. 15.

2.4.4 Calculation of Wavelength Sequence

FIG. 20 is a flowchart showing details of processing in which the exposure control processor 210 calculates the wavelength sequence. The processes shown in FIG. 20 correspond to a subroutine of S3 of FIG. 13.

In S31, the exposure control processor 210 calculates the number of in-cycle pulses Kmax corresponding to one period of the wavelength sequence by summing the number of allocation pulses Ji for all of the target center wavelengths $\lambda i$. In the example shown in FIG. 18, the number of in-cycle pulses Kmax is 10 according to the following expression.

$$Kmax = 2 + 1 + 1 + 1 + 1 + 1 + 3 = 10$$

FIG. 21 shows the wavelength sequence before improvement calculated without applying the processes of S32 to S34 of FIG. 20. As shown in FIG. 21, the target center wavelengths $\lambda i$ are allocated to each of the pulses output at Kmax timings, that is, 10 timings. The correspondence between the output timing tk and the target center wavelengths $\lambda i$ is determined such that the larger the value of k is, the larger the value of i is.

Referring back to FIG. 20, in S32, the exposure control processor 210 calculates allocation intervals IVi of the target center wavelengths $\lambda i$ having the number of allocation pulses Ji of 2 or greater by the following expression.

$$IVi = Kmax/Ji$$

The allocation interval IVi indicates how many pulses of a time interval is to be provided for the target center wavelength $\lambda i$ in the wavelength sequence. The target center wavelengths $\lambda i$ having a smaller number of allocation pulses $Ji$ has a larger allocation interval $IVi$.

In S33, the exposure control processor 210 allocates the target center wavelengths $\lambda i$ having the number of allocation pulses $Ji$ of 2 or greater to several pulses included in the wavelength sequence. Each of the target center wavelengths $\lambda i$ having the number of allocation pulses $Ji$ of 2 or greater corresponds to the first center wavelength in the present disclosure.

FIG. 22 shows a state in which the target center wavelengths $\lambda 1$, $\lambda 7$ having the number of allocation pulses $Ji$ of 2 or greater are allocated to several pulses included in the wavelength sequence in S33 of FIG. 20. Specific allocation methods are as (a) to (c) below.

(a) The target center wavelengths $\lambda i$ are allocated in ascending order of the number of allocation pulses $Ji$. That is, the target center wavelength $\lambda 1$ is allocated first, and then the target center wavelength $\lambda 7$ is allocated.

(b) The allocation interval $IVi$ of the target center wavelength $\lambda i$ is to be adopted. Therefore, as the target center wavelength $\lambda i$ has a smaller number of allocation pulses $Ji$, the time interval for the target center wavelength $\lambda i$ becomes larger. When the allocation interval $IVi$ is not an integer, the allocation interval $IVi$ is rounded off or rounded down to an integer. For example, the target center wavelength $\lambda 1$ having the number of allocation pulses $J1$ of 2 and the allocation interval $IVi$ of 5 is allocated to the pulses of the output timings $t1$, $t6$. As described above, by adopting the allocation interval $IVi$, the target center wavelength $\lambda 1$ having the number of allocation pulses $J1$ of 2 has a minimum value of the time interval in the wavelength sequence being a time period of 5 pulses, and the minimum value of the time interval is maximized by this allocation.

(c) Another target center wavelength $\lambda i$ is not allocated to the output timing $tk$ to which the target center wavelength $\lambda i$ has already been allocated. For example, the target center wavelength $\lambda 7$ having the number of allocation pulses $J7$ of 3 and the allocation interval $IVi$ of 10/3 is allocated to the pulses of the output timings $t2$, $t5$, $t8$ but not to the output timings $t1$, $t6$. Accordingly, the target center wavelength $\lambda 7$ having the number of allocation pulses $J7$ of 3 has a minimum value of the time interval in the wavelength sequence being a time period of 3 pulses, and the minimum value of the time interval is maximized by this allocation.

Referring back to FIG. 20, in S34, the exposure control processor 210 allocates the target center wavelengths $\lambda i$ having the number of allocation pulses $Ji$ of 1 to the remaining pulses included in the wavelength sequence. Each of the target center wavelengths $\lambda i$ having the number of allocation pulses $Ji$ of 1 corresponds to the second center wavelength in the present disclosure.

FIG. 23 shows the wavelength sequence after improvement in which the target center wavelengths $\lambda 2$ to $\lambda 6$ having the number of allocation pulses $Ji$ of 1 are allocated to the remaining pulses included in the wavelength sequence in S34 of FIG. 20.

When the target center wavelengths $\lambda 2$ to $\lambda 6$ having the number of allocation pulses $Ji$ of 1 are allocated, another target center wavelength $\lambda i$ is not allocated to the pulses of the output timing $tk$ to which the target center wavelength $\lambda i$ has already been allocated. That is, the target center wavelengths $\lambda 2$ to $\lambda 6$ having the number of allocation pulses $Ji$ of 1 are not allocated to the pulses of the output timings $t1$, $t2$, $t5$, $t6$, $t8$, and are allocated to any pulses of the output timings $t3$, $t4$, $t7$, $t9$, $10$ so as not to overlap each other.

As described above, the wavelength sequence is calculated.

After S34, processing of the flowchart of FIG. 20 ends, and returns to processing shown in FIG. 13.

2.5 Effect (1) According to the first embodiment, the exposure control processor 210 acquires the pulse spectral shape g of the pulse laser light B2 and the target integrated spectral shape s to be realized by the pulse laser light B2 of a plurality of pulses. The plurality of pulses are generated based on the wavelength sequence in which the center wavelength of the pulse laser light B2 is periodically changed. Further, the exposure control processor 210 calculates the plurality of target center wavelengths $\lambda i$ allocated to the plurality of pulses to realize the target integrated spectral shape s, and the number of allocation pulses $Ji$ of each target center wavelength $\lambda i$ being the number of allocation pulses $Ji$ per cycle of the wavelength sequence. Further, the exposure control processor 210 correspondingly allocates the at least one target center wavelength $\lambda 1$, $\lambda 7$ having the number of allocation pulses $Ji$ of 2 or greater among the target center wavelengths $\lambda i$ so that the smaller the number of allocation pulses $Ji$ is, the larger the time interval thereof is, and then correspondingly allocates the at least one target center wavelength $\lambda 2$ to $\lambda 6$ having the number of allocation pulses $Ji$ of 1 among the target center wavelengths $\lambda i$, thereby calculating the wavelength sequence. The exposure control processor 210 sets the target center wavelength $\lambda i$ for each pulse based on the wavelength sequence and transmits the set target center wavelength $\lambda i$ to the laser device 100a. The laser device 100a generates and outputs the pulse laser light B2 to the exposure apparatus 200a. The exposure apparatus 200a exposes a workpiece to the pulse laser light B2 in the exposure apparatus 200a to manufacture an electronic device.

Accordingly, deviation of the arrangement of the target center wavelength $\lambda i$ in the wavelength sequence can be suppressed. Therefore, it is possible to prevent the breakdown of the target center wavelengths $\lambda i$ of the pulse laser light B2 radiated over the required time T from varying depending on which of the timing from when the required time T starts out of the plurality of output timings $tk$ defined by the wavelength sequence. Therefore, it is possible to suppress variation in the integrated spectral shape depending on the position in the scan field SF.

Figure 24:
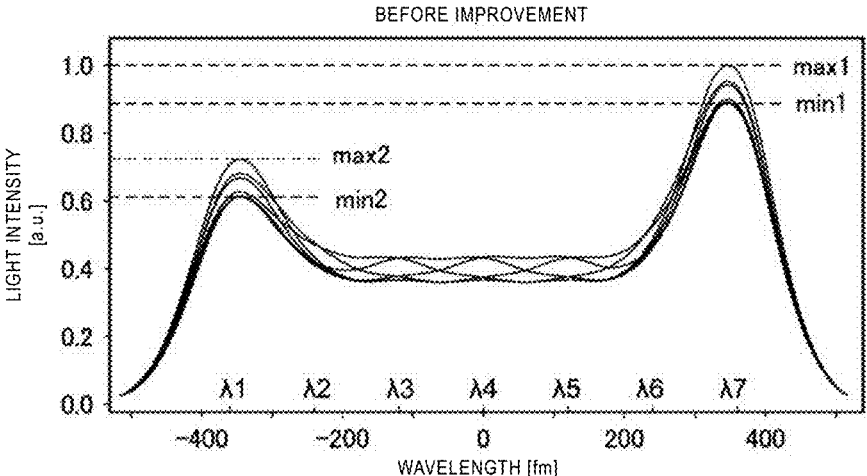
FIG. 24 shows, in a superimposed manner, 10 integrated spectral shapes obtained in accordance with the wavelength sequence before improvement shown in FIG. 21.
Figure 25:
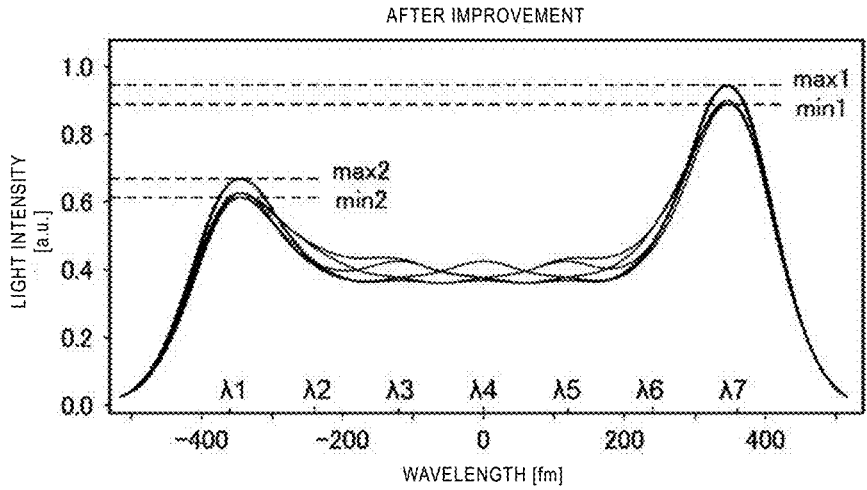
FIG. 25 shows, in a superimposed manner, 10 integrated spectral shapes obtained in accordance with the wavelength sequence after improvement shown in FIG. 23.

FIG. 24 shows, in a superimposed manner, 10 integrated spectral shapes obtained in accordance with the wavelength sequence before improvement shown in FIG. 21. FIG. 25 shows, in a superimposed manner, 10 integrated spectral shapes obtained in accordance with the wavelength sequence after improvement shown in FIG. 23. The curves included in each of FIGS. 24 and 25 include ten curves with some parts thereof overlapping each other. In FIGS. 24 and 25, the horizontal axis represents the wavelength by the deviation when the reference wavelength is 0, and the vertical axis represents the light intensity by the ratio when a maximum value max1 to be described later in FIG. 24 is 1. In FIGS. 24 and 25, the number of N slit pulses Ns is 52.

In each of the curves included in FIGS. 24 and 25, the highest peak is defined as a first peak, and the second highest peak is defined as a second peak. In any of the curves, the first peak is located near the target center wavelength $\lambda 7$ and the second peak is located near the target center wavelength $\lambda 1$.

In each of the ten curves included in FIGS. 24 and 25, the maximum value of the first peak is defined as max1, and the minimum value of the first peak is defined as min. The maximum value of the second peak is defined as max2, and the minimum value of the second peak is defined as min2.

In FIG. 24, a variation amount V1 of the first peak and a variation amount V2 of the second peak evaluated by the following expression were 12.8% and 19.2%, respectively.

$$V1 = (\text{max}1 - \text{min}1)/((\text{max}1 + \text{min}1)/2) \times 100$$

$$V2 = (\text{max}2 - \text{min}2)/((\text{max}2 + \text{min}2)/2) \times 100$$

On the other hand, in FIG. 25, the variation amount V1 of the first peak and the variation amount V2 of the second peak were improved to 6.4% and 9.6%, respectively, and it was found that the variation of the integrated spectral shape is suppressed.

(2) According to the first embodiment, the exposure control processor 210 calculates the target center wavelength $\lambda i$ based on the inverse Fourier transform p of S/G obtained by dividing the Fourier transform S of the target integrated spectral shape s by the Fourier transform G of the pulse spectral shape g.

Accordingly, an appropriate target center wavelength $\lambda i$ can be calculated by performing deconvolution on the target integrated spectral shape s with the pulse spectral shape g.

(3) According to the first embodiment, the exposure control processor 210 calculates the number of allocation pulses Ji based on the inverse Fourier transform p.

Accordingly, an appropriate number of allocation pulses Ji can be calculated by deconvolution.

(4) According to the first embodiment, the exposure control processor 210 calculates, as the target center wavelength $\lambda i$, the center wavelength corresponding to values equal to or greater than 1 among the values of the function pm obtained by dividing the inverse Fourier transform p by the minimum value pmin that is equal to or greater than the first threshold among the plurality of values included in the inverse Fourier transform p.

Accordingly, it is possible to remove noise included in the inverse Fourier transform p and calculate the target center wavelength $\lambda i$ having the number of allocation pulses Ji of 1 or greater.

(5) According to the first embodiment, the exposure control processor 210 converts, into integers, the values of the function pm obtained by dividing the inverse Fourier transform p by the minimum value pmin that is equal to or greater than the first threshold among the plurality of values included in the inverse Fourier transform p. The exposure control processor 210 calculates the center wavelengths corresponding to values equal to or greater than 1 among the values converted into integers as the target center wavelengths $\lambda i$, and calculates the value converted into an integer as the number of allocation pulse Ji for each of the corresponding target center wavelengths $\lambda i$.

Accordingly, the target center wavelength $\lambda i$ can be set for each pulse included in the pulse laser light B2 by converting the values of the function pm into integers.

(6) According to the first embodiment, the exposure control processor 210 converts the values of the function pm into integers by converting a value less than 1 to 0 and rounding off a value equal to or greater than 1 among the values of the function pm.

Accordingly, since all values less than 1 are discarded, the number of target center wavelengths $\lambda i$ can be suppressed, and the length of one cycle of the wavelength sequence can be suppressed.

(7) According to the first embodiment, the exposure control processor 210 acquires the normalized inverse Fourier transform pn by normalizing the inverse Fourier transform p so that the maximum value is 1. The exposure control processor 210 calculates, as the target center wavelengths $\lambda i$, the center wavelengths corresponding to values equal to or greater than 1 among the values of the function pnm obtained by dividing the normalized inverse Fourier transform pn by the minimum value pnmin that is equal to or greater than the second threshold among the plurality of values included in the normalized inverse Fourier transform p.

Accordingly, since the relationship between the normalized inverse Fourier transform pn and the second threshold is stabilized by normalizing the inverse Fourier transform p, the calculation of the target center wavelength $\lambda i$ can be appropriately performed.

(8) According to the first embodiment, the exposure control processor 210 acquires the normalized inverse Fourier transform pn by normalizing the inverse Fourier transform p so that the maximum value is 1. The exposure control processor 210 converts, into integers, the values of the function pnm obtained by dividing the normalized inverse Fourier transform pn by the minimum value pnmin that is equal to or greater than the second threshold among the plurality of values included in the normalized inverse Fourier transform pn. The exposure control processor 210 calculates the center wavelengths corresponding to values equal to or greater than 1 among the values converted into integers as the target center wavelengths $\lambda i$, and calculates the value converted into an integer as the number of allocation pulse Ji for each of the corresponding target center wavelengths $\lambda i$.

Accordingly, since the relationship between the normalized inverse Fourier transform pn and the second threshold is stabilized by normalizing the inverse Fourier transform p, the number of allocation pulses Ji is suppressed and the length of one cycle of the wavelength sequence can be suppressed.

(9) According to the first embodiment, the exposure control processor 210 converts the values of the function pnm into integers by converting a value less than 1 to 0 and rounding off a value equal to or greater than 1 among the values of the function pnm.

Accordingly, since all values less than 1 are discarded, the number of target center wavelengths $\lambda i$ can be suppressed, and the length of one cycle of the wavelength sequence can be suppressed.

(10) According to the first embodiment, the target center wavelength having the number of allocation pulses Ji of 2 or more among the target center wavelengths $\lambda i$ includes a plurality of target center wavelengths $\lambda$1, $\lambda$7 having the number of allocation pulses Ji different from each other. The exposure control processor 210 allocates each of the target center wavelengths $\lambda$1, $\lambda$7 in descending order of the number of allocation pulses Ji.

When the number of N slit pulses Ns is not a multiple of the number of in-cycle pulses Kmax, the variation of the integrated spectral shape cannot be completely eliminated. However, the target center wavelength $\lambda$1 having a small number of allocation pulse Ji has a larger effect on the integrated spectral shape when the breakdown of the target center wavelengths $\lambda i$ of the pulse laser light B2 radiated over the required time T varies than the target center wavelength $\lambda 7$ having a large number of allocation pulse Ji. Therefore, by allocating the target center wavelength $\lambda 1$ with priority over the target center wavelength $\lambda 7$, the target center wavelength $\lambda 1$ can be allocated substantially evenly in the wavelength sequence, and the integrated spectral shape can be stabilized.

(11) According to the first embodiment, the exposure control processor 210 allocates each of the target center wavelengths $\lambda 1$, $\lambda 7$ having the number of allocation pulses Ji of 2 or greater among the target center wavelengths $\lambda i$ so that the minimum value of the time intervals is maximized.

Accordingly, each of the target center wavelengths $\lambda 1$, $\lambda 7$ can be allocated substantially evenly in the wavelength sequence, and the integrated spectral shape can be stabilized.

(12) According to the first embodiment, the pulse laser light B2 is generated by the laser device 100a including the semiconductor laser element 65 and the current control unit 62 that changes the center wavelength of the pulse laser light B2 by controlling the current flowing through the semiconductor laser element 65.

Accordingly, the center wavelength of the pulse laser light B2 can be controlled at high speed according to the wavelength sequence.

(13) According to the first embodiment, the pulse spectral shape g is acquired by the monitor module 17 located on the optical path of the pulse laser light B2.

Accordingly, it is possible to accurately calculate the wavelength sequence from the actual measurement value of the pulse spectral shape g.

(14) The laser control processor 130 may acquire the pulse spectral shape g by reading a reference spectral shape which is the reference for the pulse spectral shape g, and the target spectral line width $\Delta \lambda t$ from the memory 132 or 212 and deforming the reference spectral shape based on the target spectral line width $\Delta \lambda t$.

Accordingly, the pulse spectral shape g can be acquired and the wavelength sequence can be calculated without actually measuring the pulse spectral shape by the monitor module 17.

(15) According to the first embodiment, the pulse spectral shape g may be acquired by reading, from the memory 132 or 212, the spectral shape of the pulse laser light output from a laser device different from the laser device 100a.

Accordingly, the pulse spectral shape g can be acquired and the wavelength sequence can be calculated without actually measuring the pulse spectral shape of the laser device 100a to be used.

(16) According to the first embodiment, the exposure apparatus 200a calculates the wavelength sequence and transmits the target center wavelength $\lambda i$ to the laser device 100a based on the wavelength sequence.

Accordingly, since the laser device 100a may output the pulse laser light B2 based on the received target center wavelength $\lambda i$, the configuration of the laser device 100a can be simplified.

In other respects, the first embodiment is similar to the comparative example.

3. EMBODIMENT IN WHICH EXPOSURE CONTROL PROCESSOR 210 TRANSMITS WAVELENGTH SEQUENCE TO LASER CONTROL PROCESSOR 130

3.1 Configuration

Figure 26:
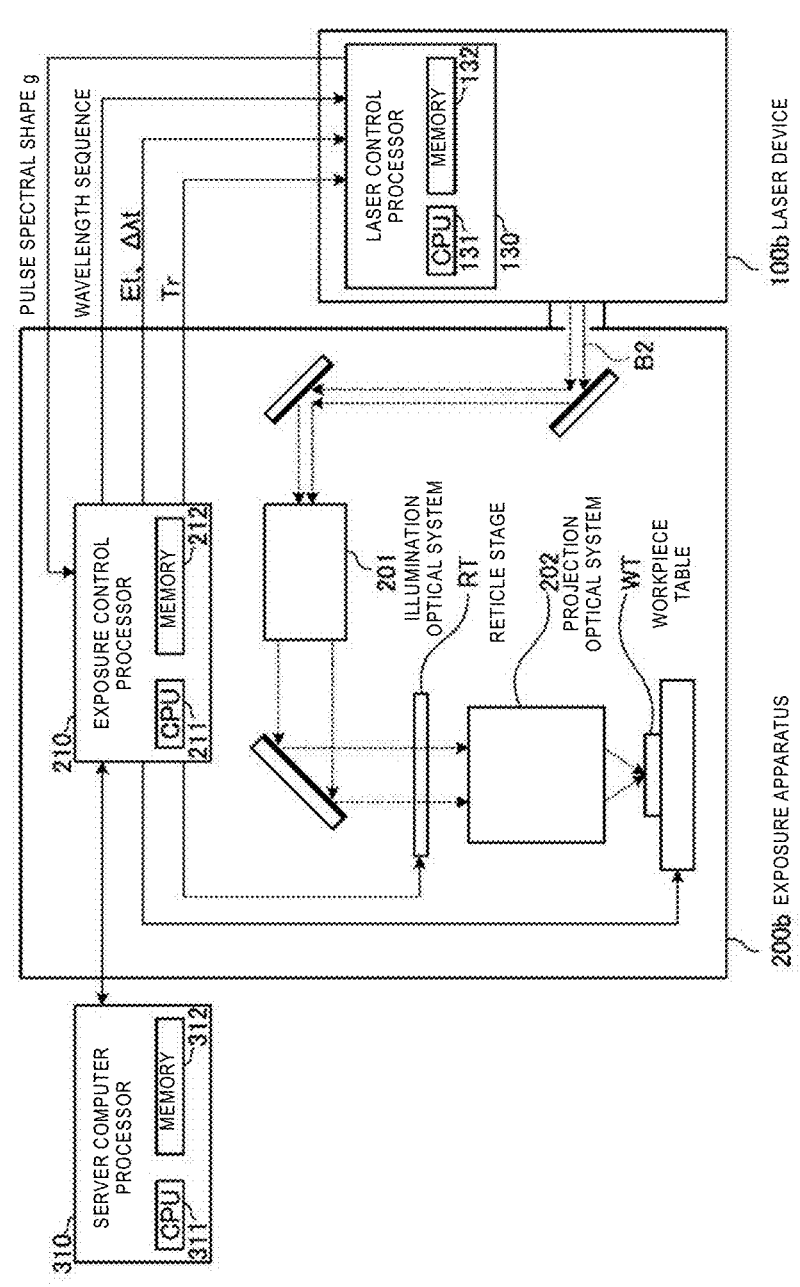
FIG. 26 schematically shows the configuration of the lithography system of a second embodiment.

FIG. 26 schematically shows the configuration of the lithography system of a second embodiment. In the second embodiment, the exposure control processor 210 included in an exposure apparatus 200b calculates the wavelength sequence and transmits the wavelength sequence to the laser control processor 130 included in a laser device 100b. The laser control processor 130 sets the target center wavelength $\lambda i$ for each pulse based on the wavelength sequence, and outputs the pulse laser light B2.

Figure 27:
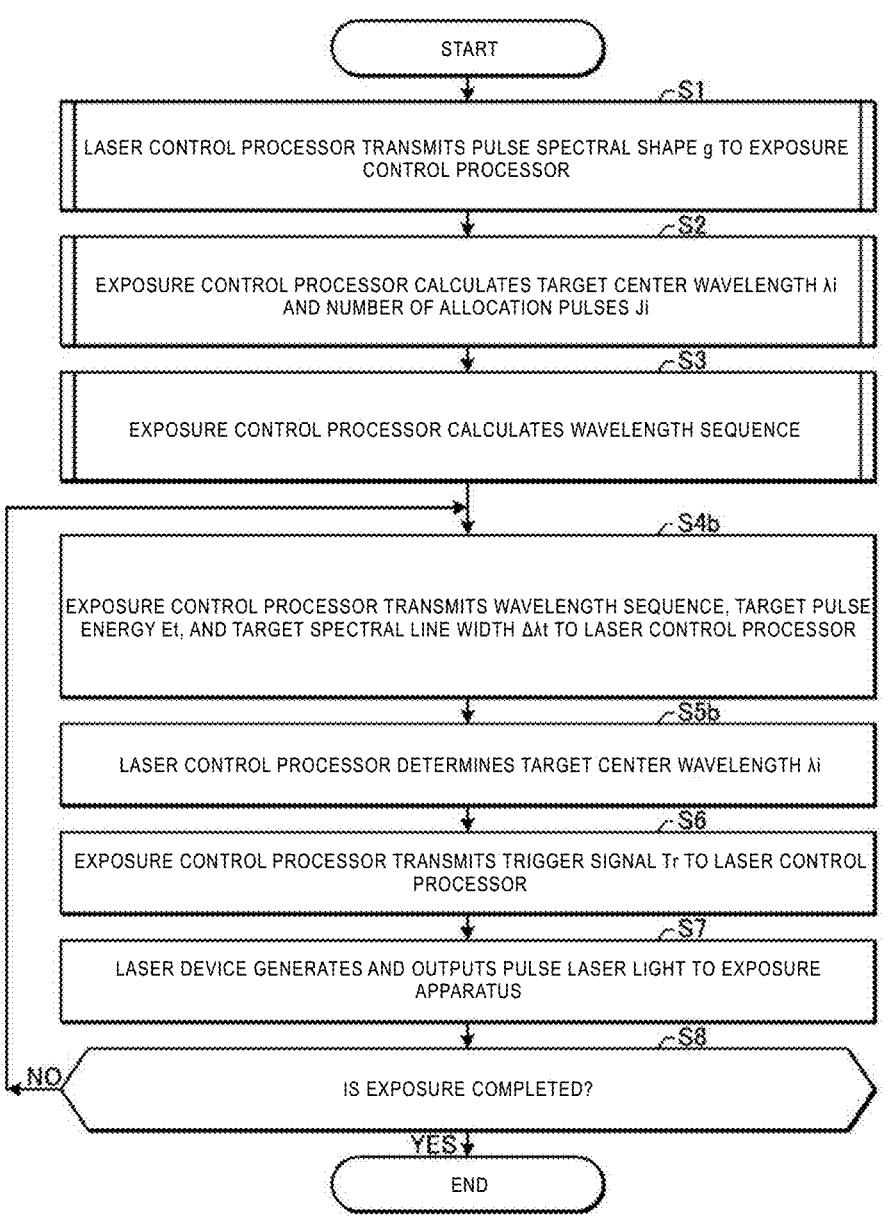
FIG. 27 is a flowchart showing the procedure of calculating the wavelength sequence based on the target integrated spectral shape in the second embodiment.

3.2 Calculation of Wavelength Sequence Based on Target Integrated Spectral Shape s FIG. 27 is a flowchart showing the procedure of calculating the wavelength sequence based on the target integrated spectral shape s in the second embodiment. The processes shown in FIG. 27 differ from the processes shown in FIG. 13 in that S4b is performed instead of S4 of FIGS. 13, and S5b is added after S4b.

In S4b, the exposure control processor 210 transmits the wavelength sequence to the laser control processor 130. Further, the exposure control processor 210 transmits the target pulse energy Et and the target spectral line width $\Delta \lambda t$ to the laser control processor 130.

In S5b, the laser control processor 130 determines the target center wavelength $\lambda i$ for each pulse based on the wavelength sequence.

3.3 Effect

(17) According to the second embodiment, the exposure apparatus 200b calculates the wavelength sequence and transmits the calculated wavelength sequence to the laser device 100b, and the laser device 100b sets the target center wavelength $\lambda i$ based on the wavelength sequence.

Accordingly, the exposure apparatus 200b is not required to transmit the target center wavelength $\lambda i$ for each pulse, and the configuration of communication devices (not shown) included in the exposure apparatus 200b and the laser device 100b can be simplified.

In other respects, the second embodiment is similar to the first embodiment.

4. EMBODIMENT IN WHICH LASER CONTROL PROCESSOR 130 CALCULATES WAVELENGTH SEQUENCE

4.1 Configuration

Figure 28:
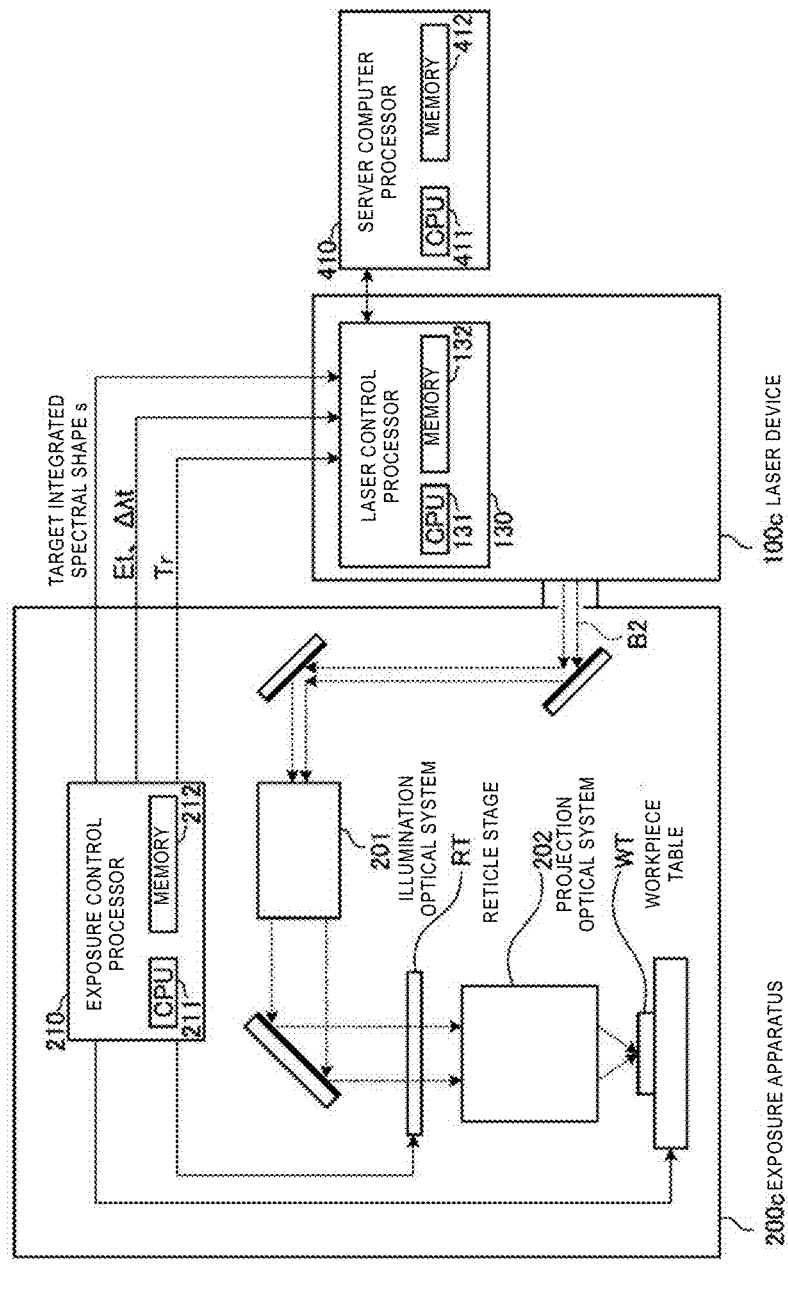
FIG. 28 schematically shows the configuration of the lithography system of a third embodiment.

FIG. 28 schematically shows the configuration of the lithography system of a third embodiment. In the third embodiment, the exposure control processor 210 included in an exposure apparatus 200c transmits the target integrated spectral shape s to the laser control processor 130 included in a laser device 100c. The laser control processor 130 calculates the wavelength sequence based on the target integrated spectral shape s, sets the target center wavelength $\lambda i$ based on the wavelength sequence, and outputs the pulse laser light B2. The laser control processor 130 of the third embodiment corresponds to the wavelength sequence calculation system in the present disclosure.

The laser control processor 130 may be connected to a server computer processor 410 external to the laser device 100c. The server computer processor 410 is a processing device including a memory 412 in which a control program is stored and a CPU 411 for executing the control program. The memory 412 includes a non-transitory computer-readable storage medium. The server computer processor 410 is specifically configured or programmed to perform various processes included in the present disclosure. In the following description, the processes (S2c and S3c) of calculating the target center wavelength λi, the number of allocation pulses Ji, and the wavelength sequence may be performed by the server computer processor 410 instead of the laser control processor 130. In this case, the server computer processor 410 corresponds to the wavelength sequence calculation system in the present disclosure. When a part of S2c and S3c is performed by the laser control processor 130 and another part thereof is performed by another processor, the combination of the processors corresponds to the wavelength sequence calculation system in the present disclosure.

Figure 29:
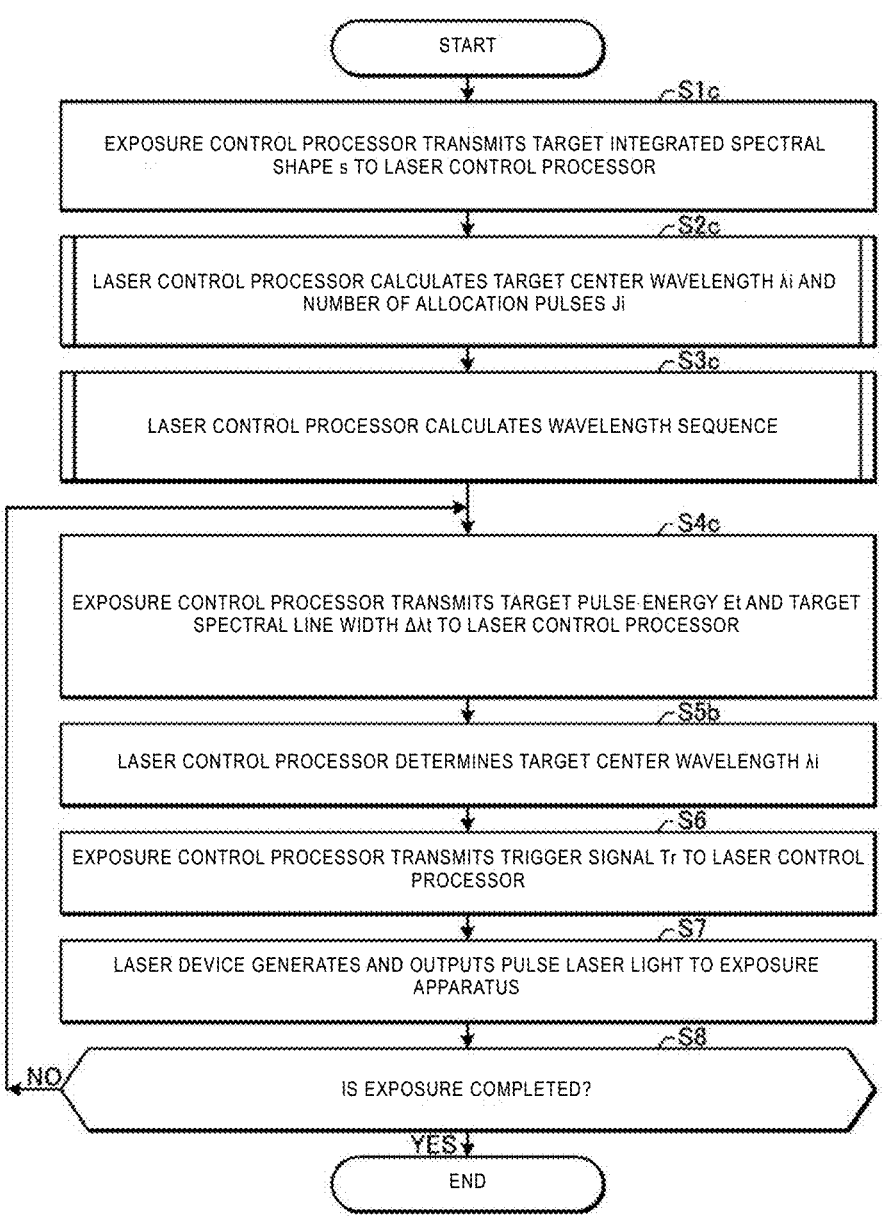
FIG. 29 is a flowchart showing the procedure of calculating the wavelength sequence based on the target integrated spectral shape in the third embodiment.

4.2 Calculation of Wavelength Sequence Based on Target Integrated Spectral Shape s FIG. 29 is a flowchart showing the procedure of calculating the wavelength sequence based on the target integrated spectral shape s in the third embodiment. The processes shown in FIG. 29 differ from the processes shown in FIG. 27 in that S1c to S4c are performed instead of S1 to S4b of FIG. 27.

In S1c, the exposure control processor 210 transmits the target integrated spectral shape s to the laser control processor 130.

In S2c, the laser control processor 130 calculates the target center wavelength λi and the number of allocation pulses Ji. The process of S2c is similar to that described with reference to FIGS. 15 to 19 except that the process is performed by the laser control processor 130 instead of the exposure control processor 210.

In S3c, the laser control processor 130 calculates the wavelength sequence. The process of S3c is similar to that described with reference to FIGS. 20 to 23 except that the process is performed by the laser control processor 130 instead of the exposure control processor 210.

In S4c, the exposure control processor 210 transmits the target pulse energy Et and the target spectral line width Δλt to the laser control processor 130.

4.3 Effect

(18) According to the third embodiment, the exposure apparatus 200c transmits the target integrated spectral shape s to the laser device 100c, and the laser device 100c calculates the wavelength sequence and sets the target center wavelength λi based on the wavelength sequence.

Accordingly, the exposure apparatus 200c is only required to transmit the target integrated spectral shape s, and the configuration of the exposure apparatus 200c can be simplified.

In other respects, the third embodiment is similar to the second embodiment.

5. OTHERS

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An electronic device manufacturing method, comprising:

acquiring a pulse spectral shape of pulse laser light, and a target integrated spectral shape to be realized by the pulse laser light of a plurality of pulses generated based on a wavelength sequence in which a center wavelength of the pulse laser light is periodically changed;

calculating a plurality of target center wavelengths allocated to the plurality of pulses to realize the target integrated spectral shape, and a number of allocation pulses of each target center wavelength being the number of allocation pulses per cycle of the wavelength sequence, the target center wavelengths including at least one first center wavelength, the number of allocation pulses of which is 2 or greater, and at least one second center wavelength, the number of allocation pulses of which is 1;

calculating the wavelength sequence by allocating the at least one first center wavelength, and then allocating the at least one second center wavelength;

generating the pulse laser light based on the wavelength sequence by a laser device;

outputting the pulse laser light to an exposure apparatus; and exposing a photosensitive substrate to the pulse laser light in the exposure apparatus to manufacture an electronic device, wherein the target center wavelengths are calculated based on an inverse Fourier transform of a third function obtained by dividing a Fourier transform of a second function representing the target integrated spectral shape by a Fourier transform of a first function representing the pulse spectral shape.

2. The electronic device manufacturing method according to claim 1, wherein the number of allocation pulses is calculated based on the inverse Fourier transform.

3. The electronic device manufacturing method according to claim 1, wherein center wavelengths corresponding to values equal to or greater than 1 among values of a fourth function obtained by dividing the inverse Fourier transform by a minimum value that is equal to or greater than a first threshold among a plurality of values included in the inverse Fourier transform are calculated as the target center wavelengths.

4. The electronic device manufacturing method according to claim 1, wherein values of a fourth function obtained by dividing the inverse Fourier transform by a minimum value that is equal to or greater than a first threshold among a plurality of values included in the inverse Fourier transform are converted into integers, and the center wavelengths corresponding to values equal to or greater than 1 among the values converted into integers are calculated as the target center wavelengths, and the values converted into integers are calculated as the numbers of allocation pulses of the corresponding target center wavelengths.

5. The electronic device manufacturing method according to claim 4, wherein the values of the fourth function are converted into integers by converting a value less than 1 to 0 and rounding off a value equal to or greater than 1 among the values of the fourth function.

6. The electronic device manufacturing method according to claim 1, wherein the center wavelengths corresponding to values equal to or greater than 1 among values of a sixth function obtained by dividing a fifth function, which is a function obtained by normalizing the inverse Fourier transform so that a maximum value is 1, by a minimum value that is equal to or greater than a second threshold among a plurality of values included in the fifth function are calculated as the target center wavelengths.

7. The electronic device manufacturing method according to claim 1, wherein values of a sixth function obtained by dividing a fifth function, which is a function obtained by normalizing the inverse Fourier transform so that a maximum value is 1, by a minimum value that is equal to or greater than a second threshold among a plurality of values included in the fifth function are converted into integers, and center wavelengths corresponding to values equal to or greater than 1 among the values converted into integers are calculated as the target center wavelengths, and the values converted into integers are calculated as the numbers of allocation pulses of the corresponding target center wavelengths.

8. The electronic device manufacturing method according to claim 7, wherein the values of the sixth function are converted into integers by converting a value less than 1 to 0 and rounding off a value equal to or greater than 1 among the values of the sixth function.

9. The electronic device manufacturing method according to claim 1, wherein the at least one first center wavelength includes a plurality of first center wavelengths, the numbers of allocation pulses of which are different from each other, and the respective first center wavelengths are allocated in descending order of the numbers of allocation pulses.

10. The electronic device manufacturing method according to claim 1, wherein the at least one first center wavelength is allocated so that a minimum value of the time interval is maximized.

11. The electronic device manufacturing method according to claim 1, wherein the pulse laser light is generated by the laser device including a semiconductor laser element and a wavelength adjuster configured to change the center wavelength of the pulse laser light by controlling a current flowing through the semiconductor laser element.

12. The electronic device manufacturing method according to claim 1, wherein the pulse spectral shape is acquired by a spectrum detector located on an optical path of the pulse laser light.

13. The electronic device manufacturing method according to claim 1, wherein the pulse spectral shape is acquired by reading a reference spectral shape which is a reference for the pulse spectral shape and a target spectral line width from a storage medium and deforming the reference spectral shape based on the target spectral line width.

14. The electronic device manufacturing method according to claim 1, wherein the pulse spectral shape is acquired by reading, from a storage medium, a spectral shape of pulse laser light output not from the laser device but from another laser device.

15. The electronic device manufacturing method according to claim 1, wherein the exposure apparatus calculates the wavelength sequence and transmits the target center wavelengths to the laser device based on the wavelength sequence.

16. The electronic device manufacturing method according to claim 1, wherein the exposure apparatus calculates and transmits the wavelength sequence to the laser device, and the laser device sets the target center wavelengths based on the wavelength sequence.

17. The electronic device manufacturing method according to claim 1, wherein the exposure apparatus transmits the target integrated spectral shape to the laser device, and the laser device calculates the wavelength sequence and sets the target center wavelengths based on the wavelength sequence.

18. A laser device comprising:

a laser oscillator capable of changing a center wavelength of pulse laser light;

a laser amplifier capable of amplifying a pulse energy of the pulse laser light output from the laser oscillator and outputting the pulse laser light; and a processor configured to:

acquire a pulse spectral shape of the pulse laser light, and a target integrated spectral shape to be realized by the pulse laser light of a plurality of pulses generated based on a wavelength sequence in which a center wavelength of the pulse laser light is periodically changed;

calculate a plurality of target center wavelengths allocated to the plurality of pulses to realize the target integrated spectral shape, and a number of allocation pulses of each target center wavelength being the number of allocation pulses per cycle of the wavelength sequence, the target center wavelengths including at least one first center wavelength, the number of allocation pulses of which is 2 or greater, and at least one second center wavelength, the number of allocation pulses of which is 1;

calculate the wavelength sequence by allocating the at least one first center wavelength, and then allocating the at least one second center wavelength; and control the laser oscillator based on the wavelength sequence, wherein the target center wavelengths are calculated based on an inverse Fourier transform of a third function obtained by dividing a Fourier transform of a second function representing the target integrated spectral shape by a Fourier transform of a first function representing the pulse spectral shape.

19. A wavelength sequence calculation system comprising:

a non-transitory storage medium readable by a computer which stores a wavelength sequence calculation program; and a CPU, the CPU being configured to execute the wavelength sequence calculation program to:

acquire a pulse spectral shape of pulse laser light, and a target integrated spectral shape to be realized by the pulse laser light of a plurality of pulses generated based on a wavelength sequence in which a center wavelength of the pulse laser light is periodically changed;

calculate a plurality of target center wavelengths allocated to the plurality of pulses to realize the target integrated spectral shape, and a number of allocation pulses of each target center wavelength being the number of allocation pulses per cycle of the wavelength sequence, the target center wavelengths including at least one first center wavelength, the number of allocation pulses of which is 2 or greater, and at least one second center wavelength, the number of allocation pulses of which is 1; and calculate the wavelength sequence by allocating the at least one first center wavelength, and then allocating the at least one second center wavelength, wherein the target center wavelengths are calculated based on an inverse Fourier transform of a third function obtained by dividing a Fourier transform of a second function representing the target integrated spectral shape by a Fourier transform of a first function representing the pulse spectral shape.

20. The electronic device manufacturing method according to claim 1, wherein the at least one first center wavelength includes a plurality of first center wavelengths including a first wavelength, the number of allocation pulses of which is a first number that is 2 or greater, and a second wavelength, the number of allocation pulses of which is a second number that is greater than the first number, and the respective first center wavelengths are allocated so that a time interval of the allocation pulses for the first wavelength is larger than a time interval of the allocation pulses for the second wavelength.

* * * * *